United States Patent [19]

Kowert

[11] Patent Number: 5,734,876
[45] Date of Patent: Mar. 31, 1998

[54] ANALYZER FOR CAPTURING ELAPSED TIME VALUES IF PREDETERMINED CONDITIONS HAVE OCCURRED OR CAPTURING MAXIMUM TIME VALUE UPON COUNTER ROLLOVER IF PREDETERMINED CONDITIONS HAVE NOT OCCURRED

[75] Inventor: Robert C. Kowert, Pflugerville, Tex.

[73] Assignee: National Instruments Corporation, Austin, Tex.

[21] Appl. No.: 473,200

[22] Filed: Jun. 7, 1995

[51] Int. Cl.$^6$ ............................................. G06F 11/25
[52] U.S. Cl. .................................. 395/555; 395/568
[58] Field of Search ...................... 348/589; 370/85.1; 371/20.1; 364/550; 395/425, 550, 575; 377/20

[56] References Cited

U.S. PATENT DOCUMENTS

| | | | |
|---|---|---|---|
| 4,559,636 | 12/1985 | Goldrian | 377/20 |
| 5,297,277 | 3/1994 | Dein et al. | 395/575 |
| 5,313,622 | 5/1994 | Truchard et al. | 395/550 |
| 5,377,344 | 12/1994 | Stager et al. | 395/425 |
| 5,457,694 | 10/1995 | Smith | 371/20.1 |
| 5,502,655 | 3/1996 | McClure | 364/550 |
| 5,568,167 | 10/1996 | Galbi et al. | 348/589 |
| 5,572,525 | 11/1996 | Shen et al. | 370/85.1 |

OTHER PUBLICATIONS

National Instruments Corporation Catalog, TNT4882, Single-Chip IEEE 488.2 Talker/Listener ASIC, Jun. 10, 1994, pp. 1-24.

1994 IEEE 488 and VXIbus Control, Data Acquisition, and Analysis, National Instruments Corporation, "GPIB Monitor/Analyzer, GPIB-410", 2-126-2-129, High-Performance Single-Chip GPIB Talker/Listener ASIC, TNT4882, pp. 2-135-2-136.

IOtech Smart Approach to Instrumentation 1993 Catalog, National Instruments Corporation, "Analyzer 488, IEEE Bus Analyzer", pp. 51-54 and pp. 37-41.

1993-1994 ICS Electronics Corporation Catalog, "IEEE 488/GPIB Bus Analyzer With Multiline Display", pp. 7-1-7-6, 4811 Bus Analyzer With Multiline Display, 6 pages (not numbered).

GPIB-410 User Manual, Mar. 1994 Edition, Part Number 320053-01, National Instruments Corporation, pp. i-xv, 1-1-4-33, A-1-I-1, and Index 1-Index 12.

*Primary Examiner*—Thomas C. Lee
*Assistant Examiner*—David Ton
*Attorney, Agent, or Firm*—Conley, Rose & Tayon; Jeffrey C. Hood; Robert C. Kowert

[57] ABSTRACT

A time-stamp timer for a GPIB system including a counter for providing elapsed time values and capture logic for capturing GPIB samples upon predetermined conditions and for capturing a maximum elapsed time value upon rollover of the counter. The GPIB samples and time values are preferably captured into a first-in, first-out (FIFO) buffer. The capture logic preferably resets the counter after GPIB signals are captured due to the predetermined conditions, so that each time value represents an elapsed time between GPIB samples. If the counter reaches a rollover condition, the capture logic causes another capture into the buffer for capturing the maximum elapsed time value. Thus, any consecutive maximum elapsed time values are summed with a final elapsed time value to determine elapsed time between any two valid GPIB captures. In one embodiment, marker logic marks each first occurrence of the maximum elapsed time value to notify software of timer rollover.

13 Claims, 10 Drawing Sheets

5,734,876

ANALYZER FOR CAPTURING ELAPSED TIME VALUES IF PREDETERMINED CONDITIONS HAVE OCCURRED OR CAPTURING MAXIMUM TIME VALUE UPON COUNTER ROLLOVER IF PREDETERMINED CONDITIONS HAVE NOT OCCURRED

CROSS-REFERENCE TO RELATED APPLICATIONS

This patent application relates to U.S. patent application Ser. No. 08/473,110, filed on Jun. 7, 1995, entitled "GPIB System for Capturing GPIB Signals at a Predetermined Rate and Upon Transitions of the Data Valid Signal", now pending; U.S. patent application Ser. No. 08/472,967, filed on Jun. 7, 1995, entitled "GPIB System Including Deglitch Method and Apparatus to Assure Valid Data Sampling", now pending; U.S. patent application Ser. No. 08/472,626, filed on Jun. 7, 1995, entitled "GPIB System with Improved Parallel Poll Response Detection" which issued July 15, 1997 as U.S. Pat. No. 5,649,123; and U.S. patent application Ser. No. 08/475,067, filed on Jun. 7, 1995, entitled "GPIB System Including Controller and Analyzer" which issued July 15, 1997 as U.S. Pat. No. 5,649,129. All of the applications are assigned to the same assignee.

FIELD OF THE INVENTION

The present invention relates to GPIB instruments, and more particularly to a GPIB system including a time-stamp timer for providing a time-stamp value indicating elapsed time between captured GPIB samples.

DESCRIPTION OF THE RELATED ART

Scientists and engineers often use laboratory and industrial instrumentation systems to perform a variety of functions, including laboratory research, process monitoring and control, data logging, analytical chemistry, tests and analysis of physical phenomena and control of mechanical or electrical machinery, to name a few examples. A plurality of I/O interface options are available for allowing communication among various instrumentation systems, including the GPIB (general purpose interface bus), the VXI bus, the RS-232 interface protocol, as well as data acquisition (DAQ) systems, as known to those skilled in the art. The present invention generally relates to the GPIB and related instruments.

The GPIB, otherwise referred to as the Institute of Electrical and Electronic Engineers IEEE-488 interface bus, was designed for remote control of programmable instruments. Thousands of measurement instruments from hundreds of suppliers are available with a GPIB interface. GPIB instruments are typically more sophisticated and have higher performance than other interface options, including DAQ and RS-232 boards. A plurality of instruments, usually up to 14, are coupled through a GPIB using eight-bit parallel protocol to achieve data transfer rates of over one megabyte per second (MB/s). The GPIB devices can be listeners, talkers and/or controllers. A talker sends data messages to one or more listeners, which receive the data. The controller manages the flow of information on the GPIB by sending commands to all devices. Some devices may perform several functions, such as a digital voltmeter which acts as a talker by sending voltage information on the GPIB and as a listener when receiving configuration and control information. Usually, there is only one controller for a given GPIB where multiple GPIB devices are further coupled to the GPIB for receiving command information from the controller for interfacing the other GPIB devices. It is noted that some GPIB configurations do not require a controller if only one device would be considered a talker and the remaining devices are listen-only devices. A controller is necessary when the active or addressed talker or listener must be changed or reconfigured where such control functions are usually handled by a computer device. Also, there may be multiple controllers on a given GPIB, although only one controller is the controller-in-charge (CIC) at any given time.

A high speed GPIB handshake protocol referred to as the HS488 is provided to increase the data transfer rate of a GPIB system. The HS488 protocol modifies the IEEE-488 source and acceptor handshake functions to achieve the high speed data transfer rates of up to eight MB/s. Any devices involved in HS488 compliant transfers must be compatible with the HS488 protocol. However, non-HS488 devices may also be coupled to a standard GPIB, where the HS488 devices must use the standard handshake protocol to assure compatibility. According to the HS488 protocol, the data valid (DAV) signal is asserted and held for a significant period, but the data signals themselves and an end or identify (EOI) control signal may only be valid for a short period of time, such as approximately 20 ns, relative to the data valid (DAV) signal.

A GPIB analyzer is used to monitor a GPIB for testing and debugging purposes, where the analyzer captures data from the GPIB for display and analysis. One such example is the GPIB-410 by National Instruments Corporation (National Instruments), which is used in a similar manner as a logic analyzer to monitor the control and data signals of the GPIB. Prior art GPIB analyzers usually sample data from the GPIB at a fixed rate. Although activity may not occur on a GPIB for a long period of time, when certain events do occur, such as data transfers according to HS488 protocol, these events occur very quickly and should be sampled and captured appropriately. Sampling at a fixed rate, even if at a very fast rate of 50 nanoseconds (ns), may still miss important events such as data signal changes which could potentially occur between 50 ns samples. This is particularly true on a GPIB also including HS488 compliant devices, where data transfers occur very quickly when compared to standard GPIB data transfer protocols. For example, 50 ns samples would detect changes of the DAV signal, but could potentially miss changes of the data and EOI signals since these signals remain valid for only a very short time period.

Most prior art GPIB analyzers connect to a GPIB system as a separate GPIB device. Thus, if a GPIB system contains the normal limit of 14 devices, a device would have to be removed to add a prior art GPIB analyzer to the GPIB system. Also, prior art GPIB analyzers are either stand-alone products containing a power supply and viewing screen, or an expansion or circuit card designed to plug into a standard computer I/O bus, such as the industry standard architecture (ISA) bus. The prior art GPIB analyzer circuit card type further requires an additional I/O slot to any GPIB controller card which may be installed in the same computer.

It is further noted that it is often desired to determine the actual or "real" time that particular information or data was captured from the GPIB. Logic analyzers, for example, often attach a time-stamp value to a particular piece of data captured from a group of signals or a bus. The logic analyzer includes a simple counter that may rollover or time-out several times, so that the time-stamp value does not indicate real time between capture events if one or more of such rollovers occur. A real-time time-stamp requires a significantly large number of counters to indicate elapsed time with a desired degree of accuracy and time increment resolution. Otherwise, the counter circuitry rolls over and the user may not be aware of such rollover. This leads to inaccurate or otherwise misleading results.

Prior art GPIB controllers and/or analyzers may obtain the status of multiple devices using the parallel poll command. Up to eight different devices can be configured to respond to the parallel poll command by assigning one of the eight GPIB data lines to each device. When the command is issued, each device asserts its assigned data line to indicate that the device is present on the GPIB and requesting service. The GPIB data byte is then retrieved for determining the status of the configured devices, where each data signal represents a one bit status. Prior art GPIB analyzers often yield inaccurate results because of the way the data is sampled during parallel polling. The response of the devices may be delayed and there is no defined hold time for a device to hold its response valid. Some prior art analyzers retrieve data at a fixed rate, so that the data could be retrieved before all of the devices have had a chance to respond or after one or more of the devices have responded and have already negated their responses by the time the data is sampled, thereby resulting in invalid or missed responses. Some devices update their poll status bit during the parallel poll command, thus such updates may be missed by a fixed rate sampling device.

Some analyzers retrieve data both at the beginning and end of the parallel poll command. However, valid responses occurring during the command may still be missed. Still other analyzers sample only at the end of the parallel poll command, thus valid responses or updated responses may be completely missed. It is desired to handle all of these cases and retrieve valid and updated responses.

In sum, it is desired to provide a GPIB analyzer with improved performance for capturing all important events occurring on a GPIB as well as for time-stamping the captured events in real-time. It is also desired to provide a GPIB analyzer that does not require additional computer or GPIB resources to those required by an existing GPIB controller.

SUMMARY OF THE INVENTION

A GPIB system according to the present invention includes a GPIB controller and a GPIB analyzer on the same circuit card. The combined controller and analyzer functions require a single connection to the GPIB and a single I/O slot in a host computer.

The GPIB system includes sampling logic for sampling the GPIB synchronously or at a predetermined rate, as well as for sampling the GPIB asynchronously, or according to changes of the DAV signal. This technique allows data to be captured at a regular interval as well as on edge transitions of the DAV signal. The synchronous logic samples data once every 50 ns. For edge transition capturing, the DAV signal itself is used as the sampling event to clock a set of flip-flops to assure that valid data is not missed by the synchronous logic. Data valid logic detects valid transitions of the DAV signal and provides a data transition select signal to select logic, which switches between the synchronous GPIB samples and the asynchronous GPIB samples. The selected samples are provided to and stored in a buffer, such as a first in, first out (FIFO) buffer. Capture logic monitors the sampled GPIB signals and the data transition select signal and enables the buffer to capture the selected sample upon predetermined capture conditions. In this manner, the correct data is detected and captured into the buffer even during fast data transitions.

Sampling data from the GPIB based on the DAV signal could result in erroneous data since the DAV signal tends to exhibit false transitions. A unique data valid deglitch circuit detects such glitches of the DAV signal and thereby separates valid from invalid DAV transitions. This assures that valid data is captured into the buffer. The deglitch circuit is preferably programmable for filtering false transitions of the DAV signal based on a clock signal. The deglitch circuit preferably includes a first memory circuit for detecting the DAV signal remaining asserted for at least two consecutive transitions of a clock signal and a second memory circuit for detecting the DAV signal remaining asserted for three consecutive clock transitions. A programmable memory circuit selects between the first and second memory circuits. Also, the deglitch circuit can include further memory circuitry for detecting the DAV signal asserted for five consecutive transitions of the clock circuit. The user can program the memory circuit to select between any one of these three conditions. Each of the memory circuits preferably comprises a set of flip-flops.

A time-stamp timer may be enabled to provide a real-time time-stamp value for each set of data captured into the buffer. If enabled, the capture logic asserts a time-stamp select signal to the select logic and enables the buffer for inserting the time-stamp value into the buffer after each capture. In this manner, all of the important transitions occurring on the GPIB are captured into the FIFO along with a real-time time-stamp value identifying when each capture occurred.

The timer includes a counter which provides a relative elapsed time between captures, where the capture logic resets the counter after each capture. In the preferred embodiment, the timer is a 16-bit counter incremented every 50 ns, which does not rollover until after approximately 3.28 milliseconds (ms). Upon such rollover, the counter asserts a time-out signal to the capture logic, which correspondingly enables the maximum timer value of FFFFh (a lower-case "h" indicating hexadecimal) to be written into the buffer. The FIFO is preferably a 2K by 18 bit buffer including two extra bits for each 16-bit data value. One of the extra bits is preferably set for the first rollover or time-out value, thereby marking the first time the timer times out. An interrupt is generated when this buffer location is read to alert the software to count remaining time-out values in order to compute the total elapsed time between true data values captured from the GPIB. The software easily calculates the real time between each of the true capture data values by summing any time-out values multiplied by 3.28 ms, as well as by multiplying other time-stamp values by 50 ns.

In this manner, a real-time timer marks all significant events on the GPIB with a relatively high resolution, which is preferably achieved using a single 16-bit counter clocked every 50 ns. It is noted that since time-out occurs only once every 3.28 ms during long periods of inactivity, the software is easily able to keep up with the FIFO, thereby preventing overflow of the FIFO. In an alternative embodiment, each time-stamp value captured into the FIFO is compared with the maximum value (FFFFh) so that the marking and interrupt method need not be used. This embodiment is preferred for certain applications which have a significant mount of overhead associated with interrupts. In either embodiment, elapsed time between capture events is easily calculated and provided to the user.

A GPIB system according to the present invention retrieves all valid and updated responses to a parallel poll command. The GPIB data is captured immediately after a parallel poll command is issued as well as after the command is deasserted. Also, a timing device causes another sample to be captured after approximately 2 microseconds (μs) to give the devices time to provide a valid response. Furthermore, more samples are captured during any data line transitions that occur while the parallel poll command remains asserted. This assures that any initial and updated responses are captured during the command, which would otherwise be missed in prior art embodiments.

Therefore, a GPIB system according to the present invention captures important events occurring on the GPIB into a buffer in an accurate manner. Also, a timer provides a real-time time-stamp value, which is inserted into the buffer following each associated captured value if desired. The real-time time-stamp has a high resolution and provides an accurate temporal determination of each captured value. Furthermore, both controller and analyzer functions are included for conserving computer resources.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
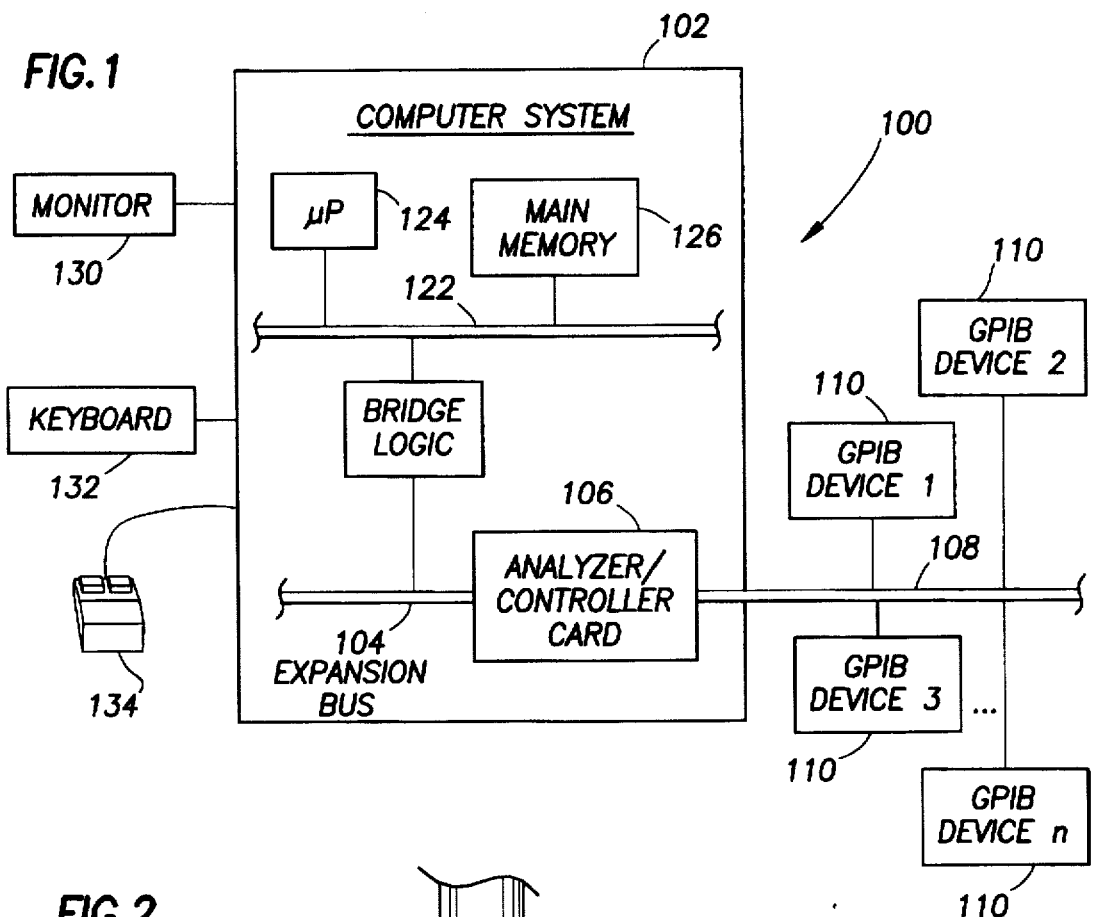
FIG. 1 is a simplified block diagram illustrating a GPIB system including a GPIB analyzer according to the present invention.

Referring now to FIG. 1, a simplified block diagram is shown of a GPIB system 100 including a GPIB analyzer and controller card 106 implemented according to the present invention. A computer 102, which is preferably a personal computer (PC) such as the XT or AT by IBM, includes an input/output (I/O) or expansion bus 104 which is preferably based on the industry standard architecture (ISA) also referred to as the AT bus. It is noted that the computer 102 may be any one of several known types such as the Apple Computer or Macintosh or may include any one of several work stations such as the Sun SPARCstation, etc. The expansion bus 104 could alternatively be based on the Extended ISA (EISA), the PCMCIA standard or the PCI (peripheral component interconnect) bus or any one of the known I/O or expansion buses of computer systems.

A GPIB analyzer/controller card 106 plugs into one of the I/O slots of the computer 102 for connecting to the expansion bus 104 of the computer 102. The GPIB analyzer/controller card 106 couples the computer 102 to a GPIB 108, also known as the IEEE 488 interface bus. At least one and normally a plurality of GPIB devices 110 are further connected to the GPIB 108 in any one of several known methods, such as series or star configurations, etc. Each of the GPIB devices 110 may be any one of thousands of instruments adapted for communicating on the GPIB 108. In this manner, the computer 102, through the GPIB analyzer/controller card 106, controls all of the GPIB devices 110 on the GPIB 108. Each of the GPIB devices 110 can be listeners, talkers and/or controllers as known to those skilled in the art. In the preferred embodiment, the GPIB analyzer/controller card 106 includes the primary controller of the GPIB 108 for controlling each of the GPIB devices 110. As will be described more fully below, the GPIB analyzer/controller card 106 further includes the GPIB analyzer for monitoring signals on the GPIB 108 for testing and debugging purposes by capturing data or control signals from the GPIB 108 for display and analysis.

The computer 102 may include bridge logic 120 for coupling the expansion bus 104 to a system (or local) bus 122, although other configurations are contemplated. The computer 102 further includes a microprocessor 124, such as an 80386, i486 or Pentim processor by Intel, and main memory 126 coupled to the system bus 122. Of course, the computer 102 also typically includes a monitor 130 and associated graphics controller (not shown) as well as input devices such as a keyboard 132 and mouse 134. In this manner, the user loads software routines into main memory 126 (from data drives, etc.) for execution by the microprocessor 124 for sending and receiving data and commands for programming and controlling the GPIB analyzer/controller card 106, and for ultimately controlling or otherwise monitoring the GPIB 108 and associated GPIB devices 110.

Figure 2:
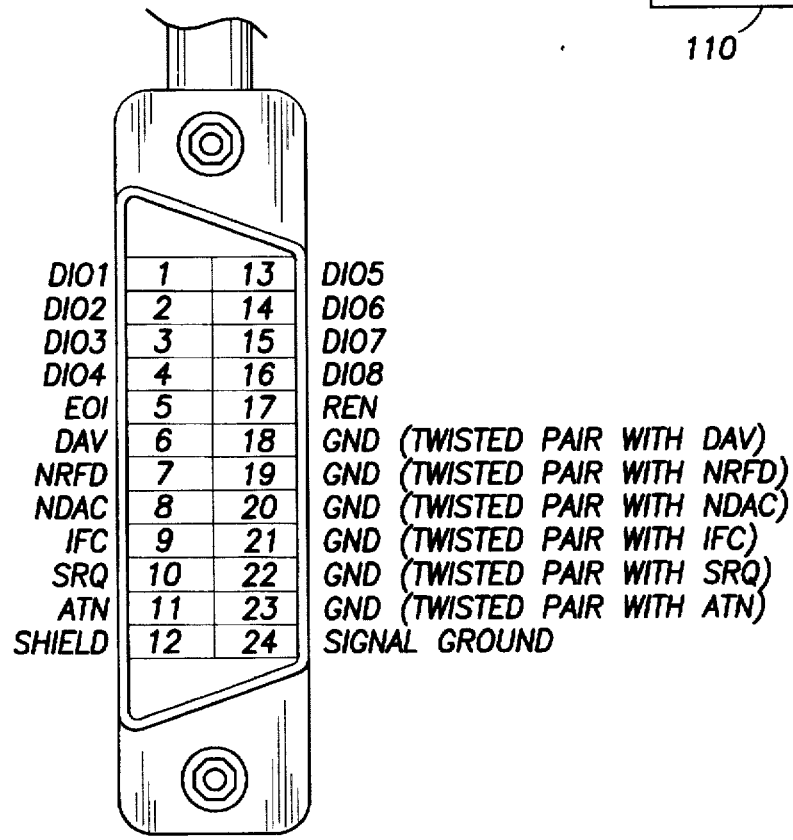
FIG. 2 is a diagram illustrating the standard GPIB signals.

Referring now to FIG. 2, a diagram is shown of a GPIB connector with standard signal assignment as known to those skilled in the art. Pin numbers 1–4 and 13–16 comprise the eight-bit data bus of the GPIB 108, including data bus signals DIO1–DIO8, otherwise referred to as the DIO signals. The connector 200 includes three handshake signals for asynchronously controlling the transfer of message bytes between the GPIB devices 110 for guaranteeing that data is sent and received without transmission error. The handshake lines include a not ready for data (NRFD) signal which indicates when a device is ready or not ready to receive a message byte. The NRFD signal is driven by any device receiving commands, by listeners when receiving data messages, and by a talker when enabling the HS488 mode. A not data accepted (NDAC) signal indicates when a device has or has not accepted a message byte. The NDAC signal is driven by any of the GPIB devices 110 when receiving commands and by listeners when receiving data messages. A data valid (DAV) signal indicates when the DIO signals are stable and valid and thus can be accepted safely by any of the GPIB devices 110. The GPIB analyzer/controller card 106 drives the DAV signal when sending commands, and a talker drives the DAV signal when sending data messages.

The GPIB 108 further includes five interface management signals for managing the flow of information across the GPIB 108. An attention (ATN) signal is driven by the GPIB analyzer/controller card 106 when using the DIO data signals to send commands, and otherwise drives the ATN signal low to allow a talker to send data messages. An interface clear (IFC) signal is driven by a controller to initialize the GPIB 108 and to establish that controller as the controller-in-charge (CIC). A remote enable (REN) signal is driven by the controller to place the devices in remote or local program mode. A service request (SRQ) signal is driven by any one of the GPIB devices 110 to asynchronously request service from the GPIB analyzer/controller card 106. Finally, an end or identify (EOI) signal is used by a talker to mark the end of a message string and is alternatively used by the controller to tell the GPIB devices 110 to identify their response in a parallel poll command.

Figure 3:
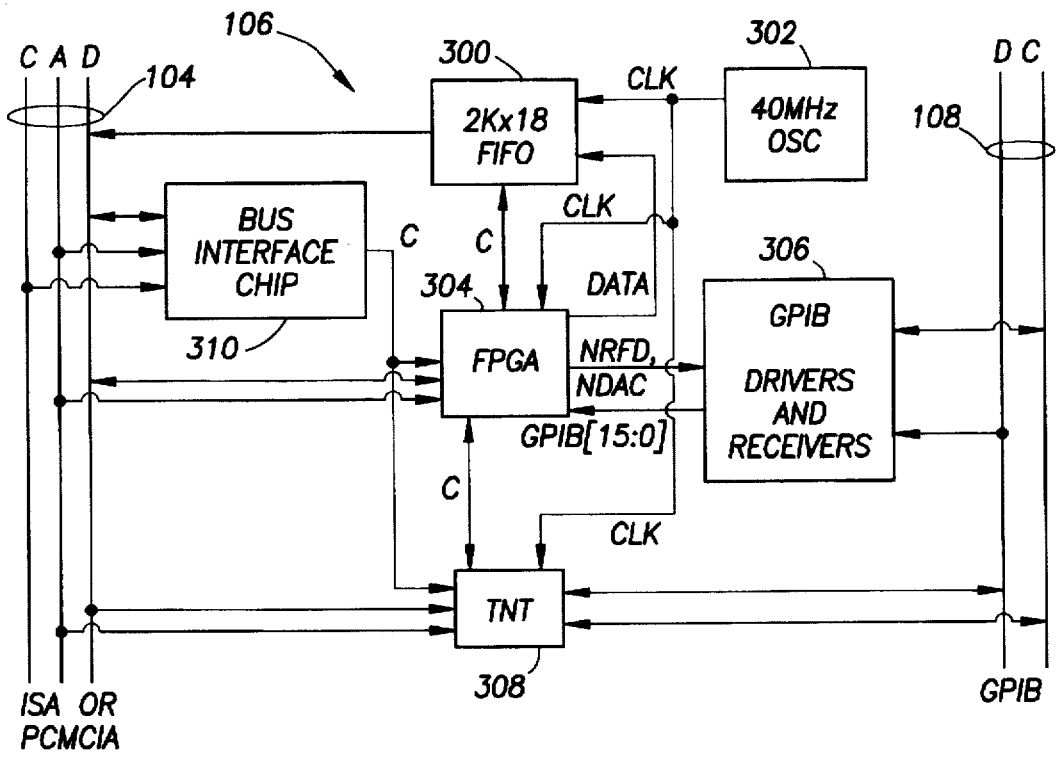
FIG. 3 is a simplified block diagram of a GPIB system according to the present invention including analyzer and controller functions.

Referring now to FIG. 3, a block diagram is shown of the GPIB analyzer/controller card 106 implemented according to the present invention. The expansion bus 104 includes control (C), address (A), and data (D) signals connected to the primary controller portion referred to as the TNT 308, which is preferably the TNT4882C ASIC by National Instruments but may be any GPIB controller circuit such as the NEC 7210. The TNT 308 is further connected to the data (D) and control (C) signals of the GPIB 108. The TNT 308 preferably performs the basic IEEE 488 talker, listener, and control functions required by the ANSI/IEEE 488.2 standard (ANSI is the American National Standard Institute). In the preferred embodiment using the ISA expansion bus, the TNT 308 preferably can sustain data transfers up to 1.5 MB/s using the IEEE 488.1 standard three-wire handshake. The TNT 308 also preferably implements the high speed GPIB protocol (HS488) for data transfers up to 1.6 MB/s on an ISA platform or 3.4 MB/s on a computer system incorporating the EISA platform. It is noted that for embodiments using different expansion buses, the TNT data transfer rates may vary. The TNT 308 is also used to monitor the GPIB 108 as well as to provide device emulation, source handshaking, and pattern generation.

Preferably, a bus interface chip 310 provides a chip select to the TNT 308 and to the primary analyzer portion, referred to as the FPGA 304. In the preferred embodiment, a bus interface chip such as the NM95MS15P from National Semiconductor that conforms to the ISA Plug and Play specification is used. The bus interface chip 310 preferably interfaces DMA (direct memory access) channels and interrupt request signals (IRQ) to the expansion bus 104. The FPGA 304 controls the capturing of the status of the GPIB 108 into a high speed 2K by 18 bit FIFO 300. Through the FPGA 304, the GPIB analyzer/controller card 106 can be configured to capture and/or trigger on any transition or state of interest on the GPIB 108. The captured status is then read from the FIFO 300 by the computer system 102 for analysis and display on the monitor 130, if desired. An oscillator 302 provides a 40 MHz clock signal (CLK) to the FIFO 300, the FPGA 304, and the TNT 308. The CLK signal is used to develop two clock signals internal to the FPGA 304, one having a 25 ns period referred to as CLK25 and another having a 50 ns period referred to as CLK50. Also, GPIB drivers and receivers 306 provide interfacing of the FPGA 304 to the GPIB 108, where the GPIB drivers and receivers 306 are used by the FPGA 304 to independently assert the control signals of the GPIB 108 for the acceptor handshake and to receive the signals of the GPIB 108 for capturing.

Figure 4:
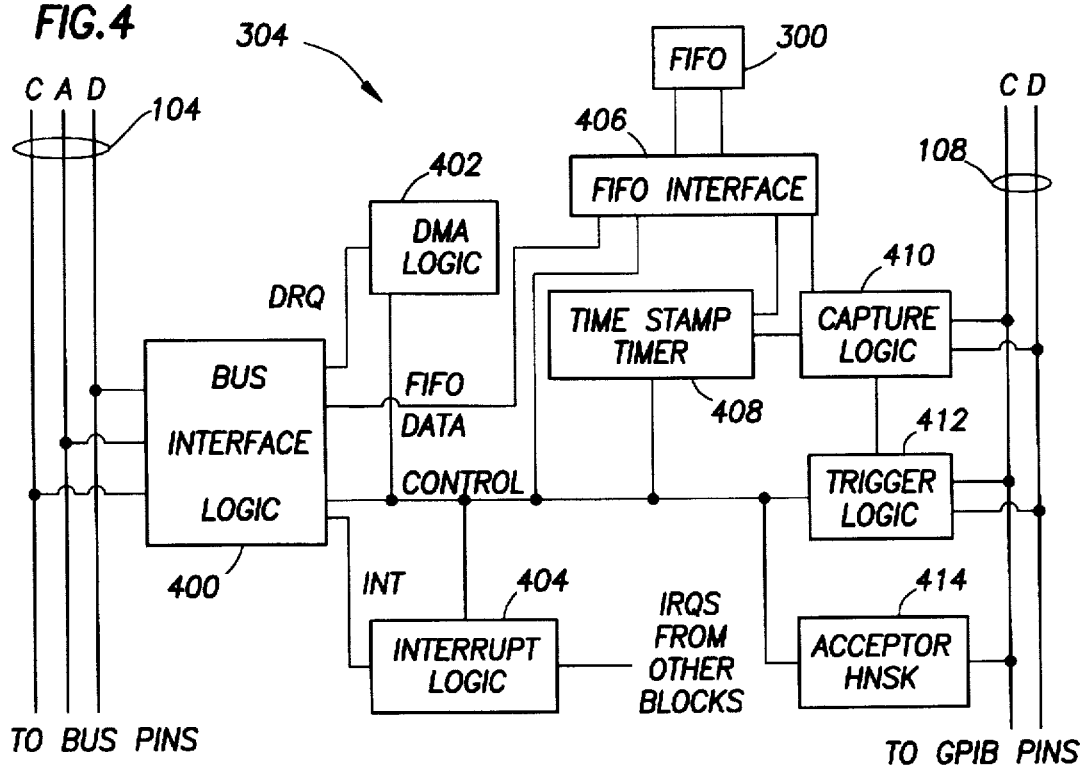
FIG. 4 is a simplified block diagram of the GPIB analyzer portion of the GPIB system of FIG. 3.

Referring now to FIG. 4, a block diagram is shown of the FPGA 304 coupled to the expansion bus 104, to the GPIB 108, and to the FIFO 300. Bus interface logic 400 decodes register accesses to the other functional blocks within the FPGA 304 and couples to the DMA logic 402 and the interrupt logic 404 to generate DMA and interrupt requests. The DMA logic 402 is connected to a FIFO interface 406 in order to detect when data is present in the FIFO 300 so that DMA may be requested to unload data from the FIFO 300. The FIFO interface 406 provides the control signals to read data from or write data to the FIFO 300.

The primary function of the FPGA 304 is to capture the state of the control and data signals of the GPIB 108 based on certain programmed conditions. The control and data signals of the GPIB 108 are all sampled every 50 ns by capture logic 410. Also the DIO and EOI signals are sampled upon assertion edge transitions of the DAV signal. This asynchronous sample of the DIO and EOI signals is desired because they might otherwise be missed at the 50 ns fixed rate if HS488 transfers are used. If a programmed capture condition is true, the sample retrieved by the capture logic 410 is provided through the FIFO interface 406 to the FIFO 300. If the capture condition is not true, the sample retrieved from the GPIB 108 is discarded. A capture enable signal referred to as CAP_EN determines whether capturing is enabled or disabled. If the CAP_EN signal is true and the FIFO 300 is not full, capturing will take place according to one of several capture conditions as follows: when a trigger condition is true; upon the occurrence of a parallel poll when a signal IDY is true, where IDY=ATN & EOI (FIG. 9); upon handshake line transitions by monitoring state changes of the NDAC, NRFD and DAV signals; upon control line transitions by monitoring the IFC, REN, ATN and SRQ signals for any state changes; upon command transfer when both the ATN and DAV signals are true; upon data transfer when ATN is false and DAV is true; upon data line transitions; upon time-stamp timer rollover of a time-stamp timer 408; and when a Force Capture Pulse Command is issued through software.

The time-stamp timer 408 includes a 16-bit counter circuit 800 (FIG. 8) preferably clocked by the CLK50 signal for a resolution of 50 ns per bit. Of course, other frequencies and resolutions are contemplated and are a matter of design choice. The timer 408 is used to determine the amount of time between capture events of the GPIB 108 through the capture logic 410. Thus, whenever time-stamping is enabled, a time-stamp value is written into the next location of the FIFO 300 after a sample is captured into the FIFO 300 from the capture logic 410, as described more fully below. In this manner, the FIFO 300 contains GPIB samples and time-stamp values in alternating locations.

Trigger logic 412 coupled to the GPIB 108, the bus interface logic 400 and the capture logic 410 allows the FPGA 304 to trigger on any predetermined pattern of signals appearing on the GPIB 108. The trigger pattern is specified and configured by a trigger and pattern register (TRPR) and a trigger mask register (TRMR). Setting a bit in the TRMR register indicates that trigger logic 412 will treat the corresponding signal on the GPIB 108 as a don't care. For each bit that is not set within the TRMR register, the trigger state of the signals of GPIB 108 are determined by the state of the corresponding TRPR register bits. Thus, a trigger condition occurs when a sample of the GPIB 108 equals the pattern specified by the TRMR and TRPR registers. Thus, if capturing is enabled and if triggering bits are set, the current GPIB sample is captured into the FIFO 300 each time the trigger condition transitions from false to true or alternatively, only the first time the trigger condition transitions from false to true.

Finally, the FPGA 304 is configured to participate in the GPIB handshake as an acceptor through acceptor handshake logic 414. Participation in the handshake is enabled by setting an HNSK_EN enable bit in a handshake configuration register. Also, the acceptor handshake logic 414 may be programmed to vary the rate of the GPIB acceptor handshake.

Figure 5:
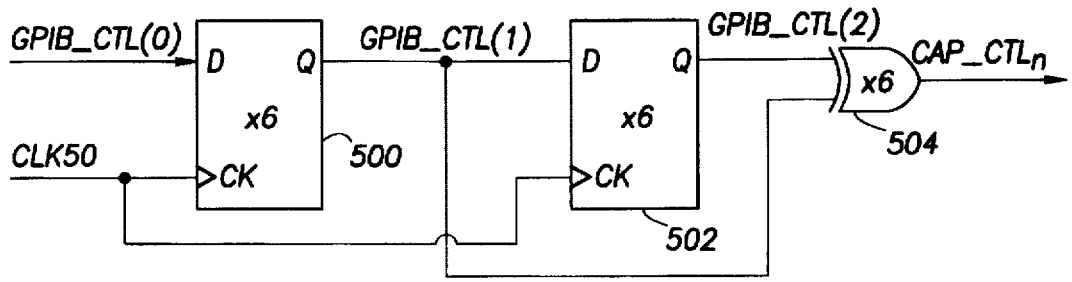
FIG. 5 is a schematic diagram illustrating the logic for capturing GPIB control signals.

Referring now to FIG. 5, a schematic diagram is shown of the logic for sampling and comparing the control signals of the GPIB 108. In particular, all of the control signals except the EOI and DAV signals, including the IFC, REN, SRQ, ATN, NRFD and NDAC signals, are collectively referred to as GPIB_CTL(0) as appearing at a time t=0 relative to the CLK50 signal on the GPIB 108. The GPIB_CTL(t) designation represents individual signals IFC(t), REN(t), SRQ(t), ATN(t), etc. The EOI signal is handled in a similar manner as the DIO signals, as described below. The DAV signal is handled in a different way which is described below. The GPIB_CTL(0) signals are each provided to the D inputs of a set of six D-type flip-flops, collectively referred to by the reference number 500. Only one flip-flop 500 is shown, it being understood that it is repeated six times for each of the control signals of the GPIB 108. It is noted that any appropriate type of latch or flip-flop may be used to sample signals of the GPIB 108, where D-type flip-flops are used in the illustrated embodiment. The CLK50 signal is provided to the clock input of the flip-flops 500 for sampling the control signals of the GPIB 108 every 50 ns, where the initial sampled versions are referred to as signals GPIB_CTL(1) at the outputs of the flip-flops 500. This process is repeated again where the GPIB_CTL(1) signals are provided to the D inputs of another set of six D-type flip-flops 502, which receive the CLK50 signal at their clock inputs. The flip-flops 502 provide signals GPIB_CTL(2) at their Q outputs, representing latched versions of the GPIB_CTL(1) signals after 50 ns.

Each of the GPIB_CTL(2) signals are provided to one input of a set of six, two-input exclusive-OR (XOR) gates 504, where the GPIB_CTL(1) signals are provided to the other input of each of the XOR gates 504. In this manner, the XOR gates 504 provide a set of CAP_CTL$_n$ signals representing change of state of the control signals of the GPIB 108 between successive clock cycles of the CLK50 clock signal, for detecting certain capture conditions as described below. The subscript "n" represents multiple signals, where CAP_CTL$_n$ generally represents all of the signals CAP_IFC, CAP_REN, CAP_SQR, CAP_ATN, CAP_RFD and CAP_DAC denoting changes of the IFC, REN, SQR, ATN, NRFD and NDAC signals, respectively.

Figure 6A:
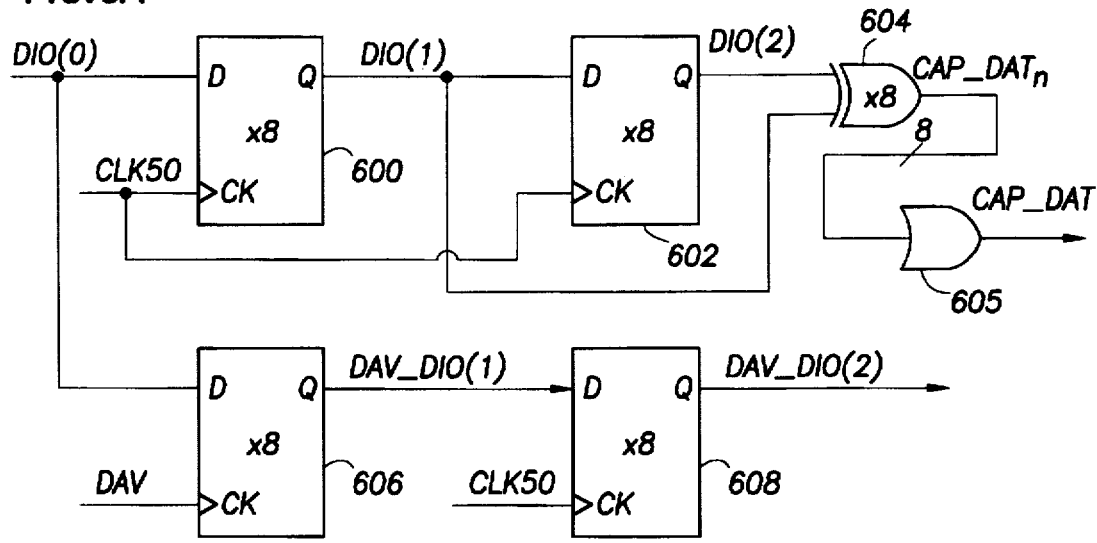
FIG. 6A is a schematic diagram illustrating logic for capturing the data signals of the GPIB.

Referring now to FIG. 6A, a schematic diagram is shown for sampling and detecting changes of the DIO signals on the GPIB 108. The DIO signals, collectively referred to as DIO(0), are provided to the D inputs of a set of eight D-type flip-flops 600, receiving the CLK50 signal at their respective clock inputs. The Q outputs of the flip-flops 600 provide signals DIO(1), which are latched versions of the DIO(0) signals. The DIO(1) signals are provided to the D inputs of another set of eight D-type flip-flops 602, each receiving the CLK50 signal at their respective clock inputs. The Q outputs of the flip-flops 602 provide latched signals DIO(2) which are each provided to one input of a set of eight two-input XOR gates 604. The DIO(1) signals are provided to the other respective inputs of the XOR gates 604, which provide a set of eight CAP_DAT$_n$ signals to the respective inputs of an eight input OR gate 605, which asserts a signal CAP_DAT at its output. Thus, the CAP_DAT signal is asserted when any of the DIO signals change state. In this manner, the data signals of the GPIB 108 are sampled at 50 ns intervals in a similar manner as the control signals of the GPIB 108 described above in FIG. 5, except that a single signal CAP_DAT identifies any changes of state of the DIO data signals.

The DIO(0) signals are also provided to the respective D inputs of a set of eight D-type flip-flops 606, each receiving the DAV signal at their respective clock inputs. In this manner, each of the DIO signals appearing on the GPIB 108 are sampled with each assertion of the DAV signal by the flip-flops 606, which provide signals DAV_DIO(1) at their respective Q outputs. The DAV_DIO(1) signals are provided to the respective D inputs of a set of eight D-type flip-flops 608 receiving the CLK50 clock signal at their respective clock inputs. The flip-flops 608 provide a set of signals DAV_DIO(2) signals at their Q outputs. In this manner, the DIO(t) signals generally represent samples of the data signals on the GPIB 108 at a fixed interval of 50 ns, whereas the DAV_DIO(t) signals represent the data signals of the GPIB 108 when the DAV signal is asserted. In this manner, very fast changes of the DIO data signals, which might otherwise be missed by a fixed rate capture of 50 ns are captured by the flip-flops 606.

Figure 6B:
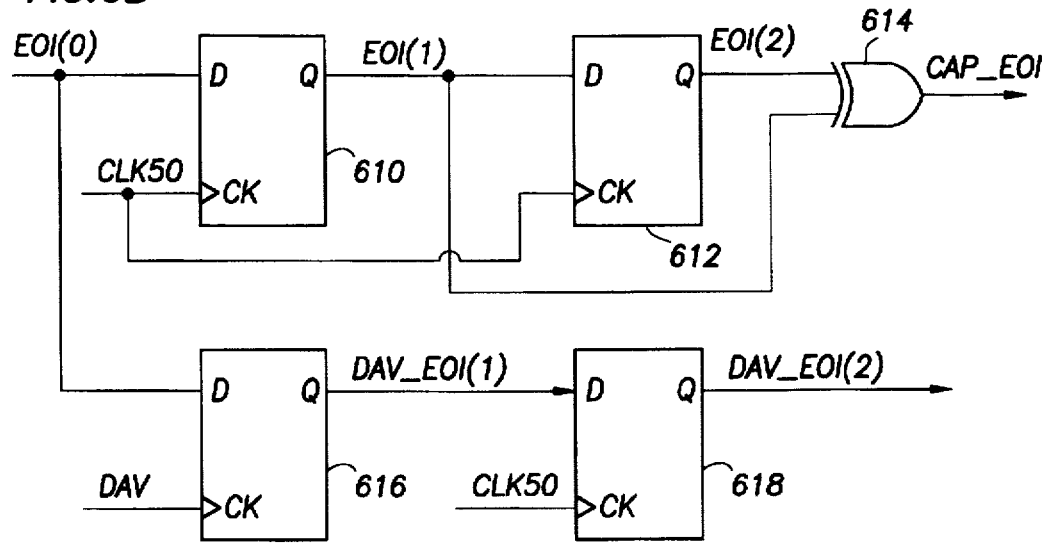
FIG. 6B is a schematic diagram illustrating logic for capturing the end or identify control signal of the GPIB.

Referring now to FIG. 6B, a schematic diagram is shown illustrating logic for capturing the EOI signal of the GPIB 108, which is similar to the logic for capturing the DIO data signals. The EOI signal is provided to the D inputs of two D-type flip-flops 610 and 616. The flip-flop 610 receives the CLK50 signal at its clock input and provides a latched EOI(1) signal at its Q output. The EOI(1) signal is provided to another D flip-flop 612, which is also clocked by the CLK50 signal for providing a signal EOI(2) at its Q output. The EOI(1) and EOI(2) signals are provided to the respective two inputs of a two-input XOR gate 614, which provides a signal CAP_EOI at its output indicating changes of the EOI signal. The flip-flop 616 is clocked by the DAV signal for sampling the EOI signal upon assertions of the DAV signal, where this sampled value is provided as a signal DAV_EOI(1) at the Q output of the flip-flop 616. The DAV_EOI(1) signal is provided to the D input of another D flip-flop 618, which is clocked by the CLK50 signal for providing a signal DAV_EOI(2) at its Q output. In this manner, changes of the EOI signal are sampled along with the DIO signals upon assertion transitions of the DAV signal.

Figure 7A:
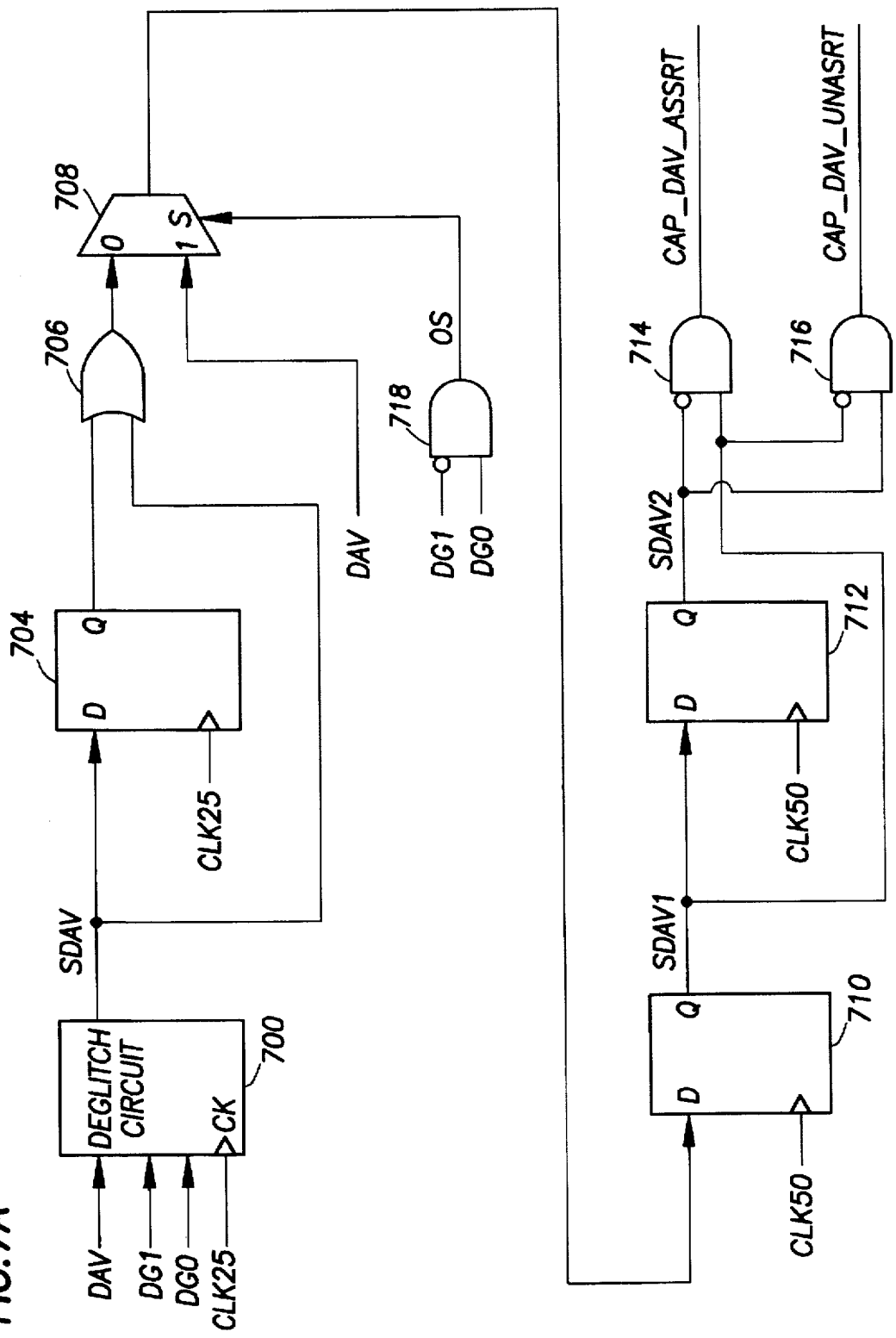
FIG. 7A is a schematic diagram of the logic for identifying the assertion of the DAV signal of the GPIB.

Referring now to FIG. 7A, a schematic diagram is shown illustrating the logic for detecting transitions of the DAV signal on the GPIB 108. The DAV signal is provided to a deglitch circuit 700, which provides a signal SDAV at its output. It is noted that spurious assertions of the DAV signal could cause erroneous collection of data which is not desired by the user. Such erroneous data may be sampled by the flip-flops 606, but are not captured as described before. The deglitch circuit 700 generally detects the spurious assertions of the DAV signal providing a filtered version as the SDAV signal. The SDAV signal is provided to the D input of a D-type flip-flop 704, receiving the CLK25 clock signal at its clock input, where the SDAV signal and the Q output of the flip-flop 704 are both provided to the two inputs of an OR gate 706 for providing its output to the binary 0 input of a multiplexer (mux) 708. The DAV signal is also provided to the binary 1 input of the mux 708, which receives an override signal OS at its select input. The output of the mux 708 reflects the selected binary input based on the state of the select signal provided to the mux 708.

A signal DG0 is provided to the non-inverted input of a two input AND gate 718, which asserts the OS signal at its output. Another signal DG1 is provided to the inverting input of the AND gate 718. As described below, the DG0 and DG1 signals set timing parameters within the deglitch circuit 700. The OS signal is asserted when deglitching is turned off and the deglitch circuit 700 is effectively bypassed. The output of the mux 708 is provided to the D input of a D-type flip-flop 710, receiving the CLK50 signal at its clock input. The Q output of the flip-flop 710, referred to as a signal SDAV1, is provided to the D input of a D-type flip-flop 712 receiving the CLK50 signal at its clock input. The Q output of the flip-flop 712 is a signal SDAV2, which is provided to the inverting input of a two-input AND gate 714, which receives the SDAV1 signal at its non-inverting input and which provides the CAP_DAV_ASSRT signal at its output. The SDAV1 signal is provided to the inverted input of another two-input AND gate 716, which receives the SDAV2 signal at its non-inverting input for providing the CAP_DAV_UNASRT signal.

Operation of the circuit shown in FIG. 7A is now described. It is noted that the DAV signal valid transitions are normally held long enough for capture by a 50 ns fixed rate sampling period. However, it is desired not to capture sampled data in the event the DAV signal transition was spurious and not associated with a valid data change. Any valid assertions of the DAV signal on the GPIB 108 as detected by the deglitch circuit 700 are asserted as the SDAV signal for at least 25 ns. The OR gate 706 detects any assertions or deassertions of the DAV signal. When OS is low, such assertions or deassertions are captured by the flip-flop 710, which are provided to the flip-flop 712 and also to the AND gate 714. Thus, the output of the AND gate 714 asserts the CAP_DAV_ASSRT signal when the DAV signal is asserted from low to high during any 50 ns clock cycle. Deassertions or negations of the DAV signal are detected by the AND gate 716 as the CAP_DAV_UNASRT signal in a similar manner.

Figure 7B:
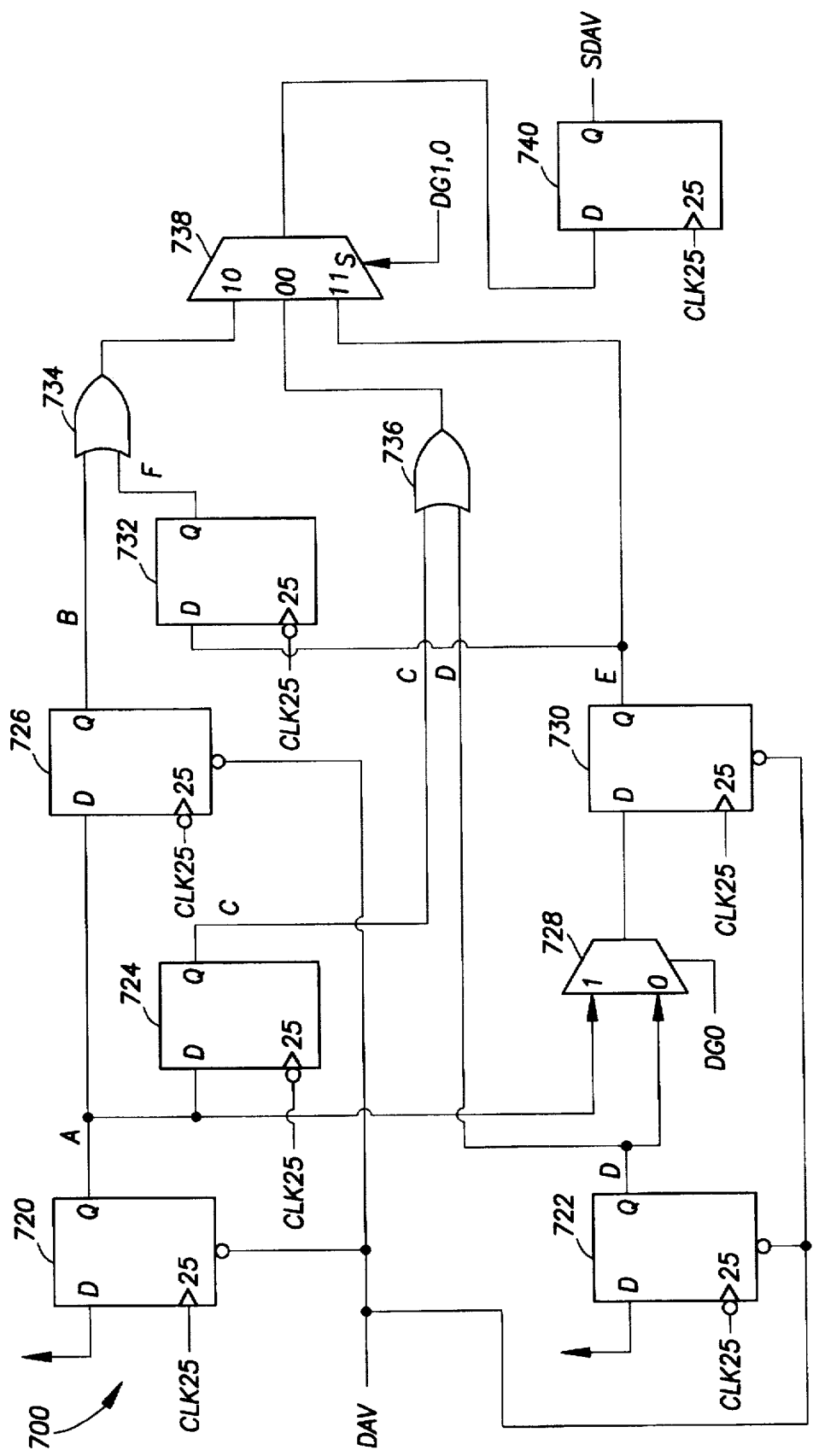
FIG. 7B is a schematic diagram of the deglitch circuit of FIG. 7A.

Referring now to FIG. 7B, a schematic diagram is shown of the deglitch circuit 700. The DAV signal is provided to the asynchronous clear inputs of four D-type flip-flops 720, 722, 726 and 730. The flip-flops 720, 722, 726 and 730 receive the CLK25 signal at their clock inputs, although the flip-flops 722 and 726 invert the CLK25 signal and thus are clocked on the falling edges. The D inputs of flip-flops 720, 722 are fixed at a high logic level. The Q output of flip-flop 720 is provided to the D input of flip-flop 726, to the D input of another flip-flop 724 and to the binary 1 input bit of a two-input mux 727. The flip-flop 724 receives the CLK25 signal at its inverted clock input. The Q output of flip-flop 722 is provided to the binary 0 input of the mux 728, which receives the DG0 signal at its select input. The output of mux 728 is provided to the D input of the flip-flop 730, which provides its output to the D input of another flip-flop 732 receiving the CLK25 signal at its inverted clock input. The Q output of the flip-flop 732 is provided to one input of a two-input OR gate 734, which receives the Q output of the flip-flop 726. The output of the OR gate 734 is provided to the binary 10 input of a three-input mux 738, which receives the DG1, DG0 signals at its two select inputs and provides its output to the D input of a D-type flip-flop 740. The flip-flop 740 receives the CLK25 signal at its clock input and provides the SDAV signal at its output. The Q outputs of the flip-flops 722, 724 are provided to the respective inputs of a two-input OR gate 736, which provides its output to the binary 00 input of the mux 738. The Q output of the flip-flop 730 is connected to the binary 11 input of the mux 738.

The deglitch circuit 700 is programmed using the DG0 and DG1 signals to provide pulse rejection and recognition according to the following table 1:

TABLE 1

Programming values for the DAV Deglitch Circuit

| DG1, DG0 | Max Pulse Rejected (ns) | Min Pulse Recognized (ns) |
| --- | --- | --- |
| 00 | 12.5 | 25 |
| 01 | not used-OS asserted | not used-OS asserted |
| 10 | 25 | 37.5 |
| 11 | 50 | 75 | where the maximum pulse rejected indicates that the deglitch circuit 700 will reject any pulse less than the indicated duration and the minimum pulse recognized indicates that the deglitch circuit 700 is guaranteed to recognize a pulse greater than the indicated duration. For clarity, the output signals of the flip-flops 720, 726, 724, 722, 730 and 732 are shown as signals A, B, C, D, E and F, respectively, although signals E and F are referred to as two separate signals, E0, E1 and F0, F1, respectively, in timing diagrams (FIGS. 7C, 7D) depending upon the state of the DG0 signal.

The general operation of the deglitch circuit 700 is now described. The maximum rejected and minimum recognized pulse times are based on transitions of the CLK25 signal. For the DG1, 0=00 case, a DAV pulse must remain asserted during at least two consecutive transitions of the CLK25 signal, which means for more than 12.5 ns, to be detected by the flip-flop 740. Pulses less than to 12.5 ns do not meet this criterion and are rejected. It is noted that pulses exactly equal to 12.5, 25, 37.5 ns etc. having edges concurrent with the CLK25 transitions may or may not meet the timing parameters and are a matter of probability. Such exact cases are considered trivial and will be ignored for purposes of this disclosure. For the DG1, 0=00 case, the A signal is asserted by the flip-flop 720 whenever the DAV signal is true on a rising edge of the CLK25 signal, but is only asserted while DAV is true. If DAV is true for at least 12.5 ns, then the flip-flop 724 asserts the C signal. Since the flip-flop 724 remains asserted for a full clock cycle, the flip-flop 740 detects whether the DAV signal is asserted on a rising edge and lasts at least until the following falling edge of the CLK25 signal. The flip-flop 722 asserts the D signal when DAV is true on a falling edge of the CLK25 signal, but only for so long as DAV remains true. If DAV remains true for at least 12.5 ns until the following rising edge of the CLK25 signal, then the flip-flop 740 detects this pulse. In this manner, any pulse greater than 25 ns is guaranteed to be detected by the flip-flop 740, pulses less than 12.5 ns will always be rejected and those between 12.5 and 25 ns that encompass two consecutive transitions of CLK 25 are detected.

In a similar manner, a DAV pulse must remain asserted for three consecutive transitions of the CLK 25 signal (25 ns) to be detected when DG1, 0=10. In this case, the B signal is asserted if the DAV pulse is true on a rising edge and lasts at least until the following falling edge. However, the flip-flop 740 only detects the assertion of the B signal if the DAV pulse remains asserted until the following rising edge, since otherwise the flip-flop 726 is cleared. Also, the F signal is asserted by the flip-flop 732 only if the DAV pulse is true on a falling edge as detected by the flip-flop 722, and if the pulse remains true until the next falling edge, since otherwise the flip-flops 722 and 730 are cleared. Thus, the DAV pulse must be true for three consecutive transitions of the CLK25 signal. Thus, pulses greater than 37.5 ns are always detected while pulses less than 25 ns are always rejected. Pulses between 25 and 37.5 ns are only detected as long as they encompass three consecutive CLK25 transitions.

For the DG1, 0=11 case, a DAV pulse must remain asserted for three consecutive rising edges of the CLK 25 signal (50 ns). The first and second rising edges are detected by the flip-flops 720 and 730, respectively, which are cleared unless the pulse remains asserted until the following rising edge of the CLK25, where the E signal is latched by the flip-flop 740. Thus, pulses equal to or less than 50 ns are always rejected while pulses greater than 75 ns are always detected. Again, any pulses having a duration between 50 and 75 ns are detected as long as they remain asserted during three consecutive rising edges.

Figure 7C:
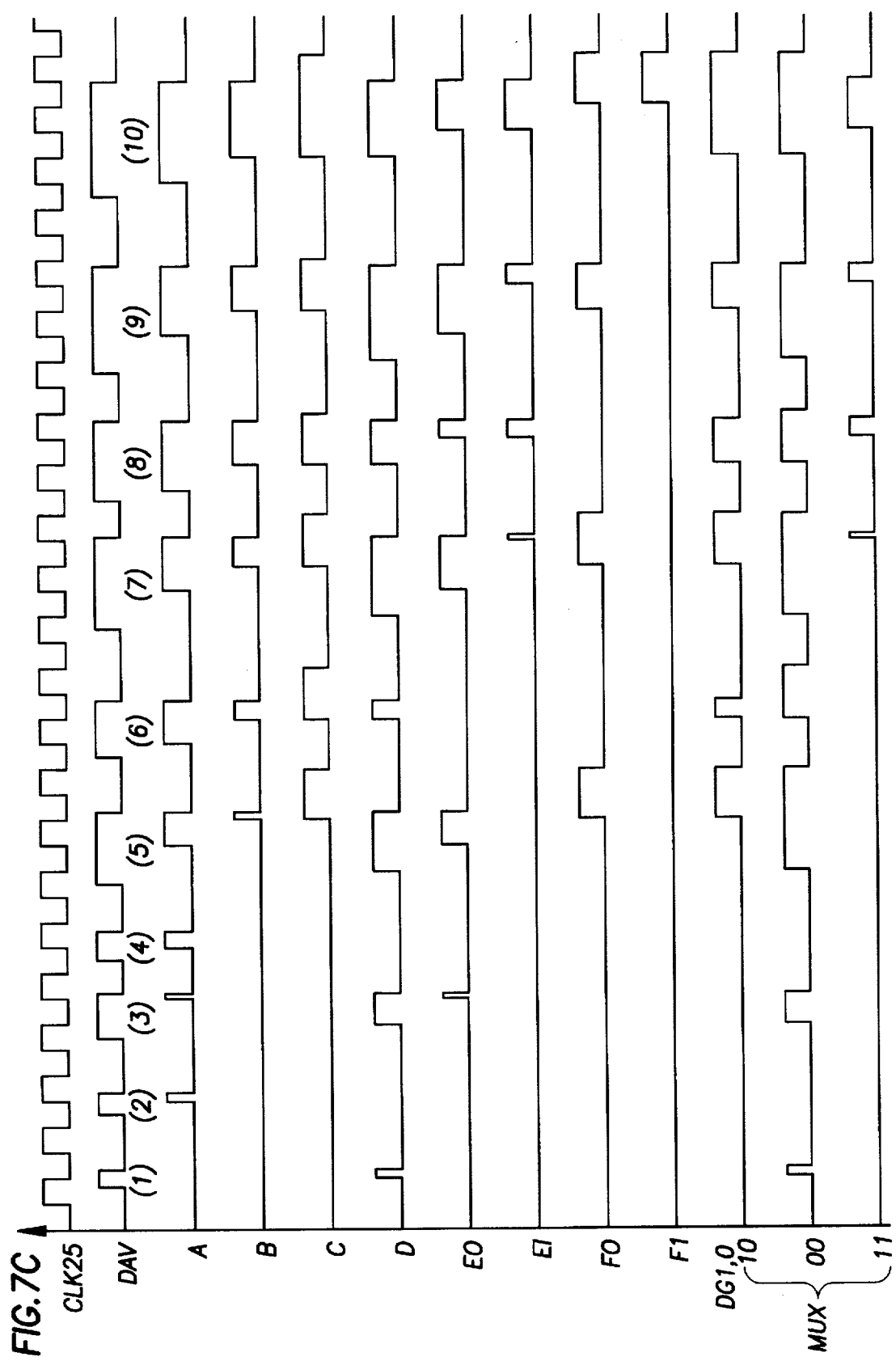
FIGS. 7C and 7D are timing diagrams illustrating operation of the deglitch circuit of FIGS. 7A and 7B.
Figure 7D:
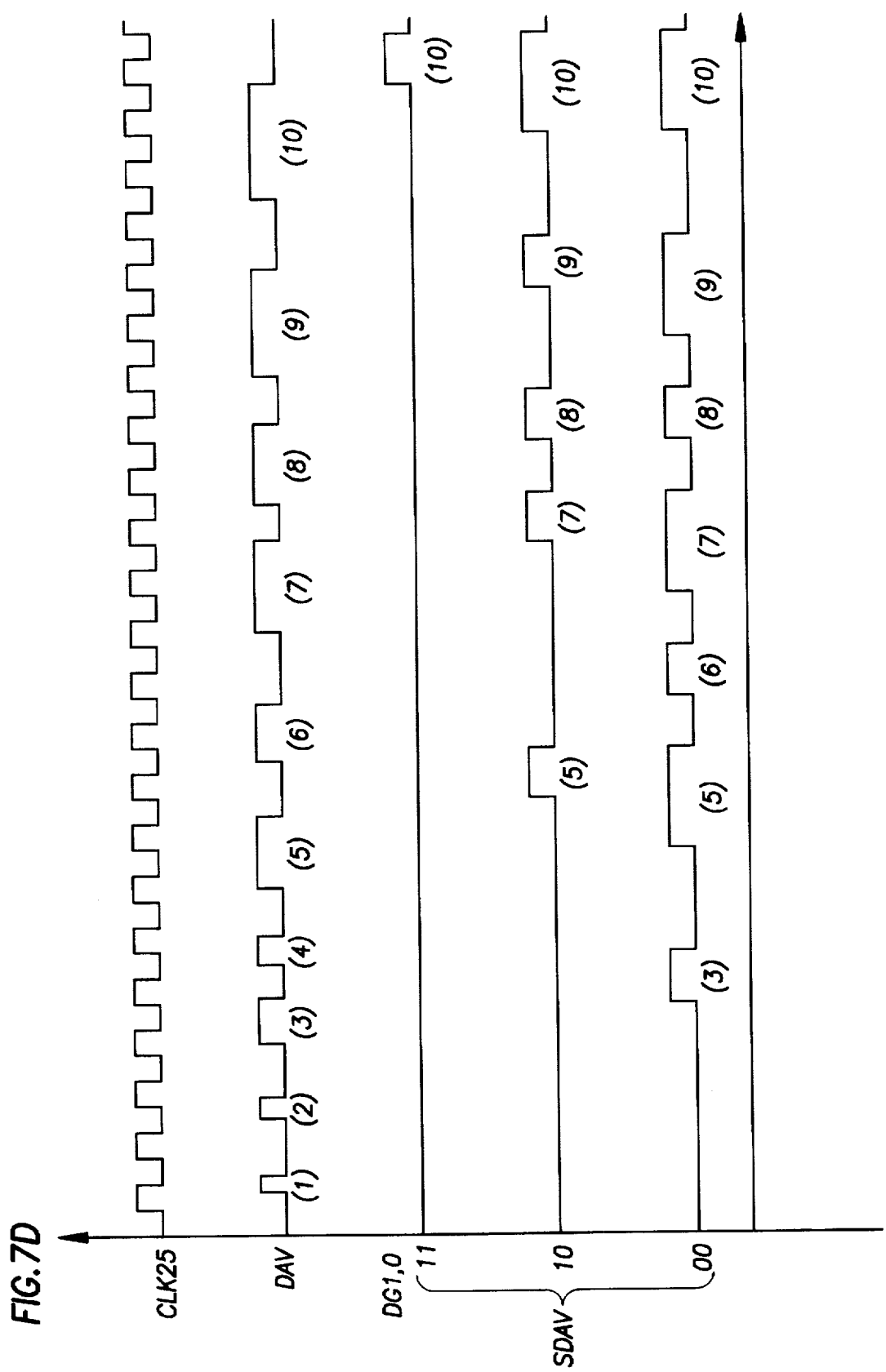

Referring now to FIG. 7C and 7D, timing diagrams are shown illustrating operation of the deglitch circuit 700. In FIG. 7C, the CLK25 signal is provided at the top and ten pulses are shown asserted on the DAV signal, where pulses 1 and 2 have durations greater than 6 but less than 12.5 ns, pulses 3 and 4 have durations greater than 12.5 but less than 25 ns, pulses 5 and 6 have durations greater than 25 but less than 37.5 ns, pulses 7 and 8 have durations greater than 37.5 but less than 50 ns and where pulses 9 and 10 have durations greater than 50 ns. For purposes of illustration, pulses 3, 5, 7 and 10 have slightly longer durations than corresponding respective pulses 4, 6, 8 and 9. The output of the mux 738 is shown based on the DG0 and DG1 signals. In FIG. 7D, the CLK25 and DAV signals are repeated and the SDAV signal is shown based on the DG0 and DG1 signals for cases 11, 10 and 00, respectively.

Inspection of FIG. 7D reveals that pulses 1 and 2, being less than 12.5 ns, are not detected and thus are rejected in all three cases of the DG1, 0 signals. Pulses 3 and 4 are between 12.5 and 25 ns, yet only pulse 3 is detected for the DG1, 0=00 case since pulse 3 encompasses two consecutive transitions of the CLK25 signal while pulse 4 does not. Both pulses 3 and 4 are rejected by the DG1, 0=10 and 11 cases. Pulses 5 and 6 are both between 25 and 37.5 ns and thus are detected for the DG1, 0=00 case and yet rejected for the DG1, 0=11 case. Since pulse 5 encompasses three consecutive CLK25 transitions while pulse 6 does not, pulse 5 is accepted and pulse 6 is rejected for the DG1, 0=10 case. Pulses 7 and 8 are both between 37.5 and 50 ns and thus are detected by both DG1, 0=00, 10 cases, yet rejected by the DG1, 0=11 case. Finally, pulses 9 and 10 are between 50 and 75 ns and detected by both DG1, 0=00, 10 cases, but only pulse 10 is detected by the DG1, 0=11 case since it encompasses three consecutive CLK25 rising edges, while pulse 9 does not. Although not shown, any pulses greater than 75 ns are detected by all three cases.

Figure 8:
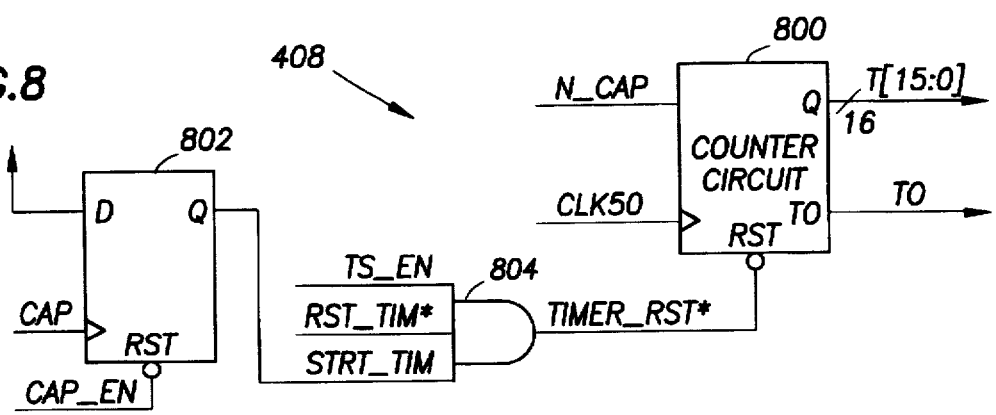
FIG. 8 is a schematic diagram of the time-stamp timer of FIG. 4.

Referring now to FIG. 8, a schematic diagram of the time-stamp timer 408 is shown. The time-stamp timer 408 includes a 16-bit counter circuit 800, preferably including a 16-bit up-counter, which receives the CLK50 clock signal at a clock input. The counter circuit 800 receives a signal N_CAP, which is asserted when any capture conditions are true except rollover of the counter circuit 800. The counter circuit 800 includes an inverted reset input receiving a signal TIMER_RST*, which is asserted by a three-input AND gate 804. An asterisk (*) at the end of a signal name denotes negative logic, where the signal is considered asserted when low and negated when high. Thus, the counter circuit 800 is cleared when TIMER_RST* is asserted low, so that the counter circuit 800 goes to zero and begins counting up again when TIMER_RST* is negated.

Figure 13:
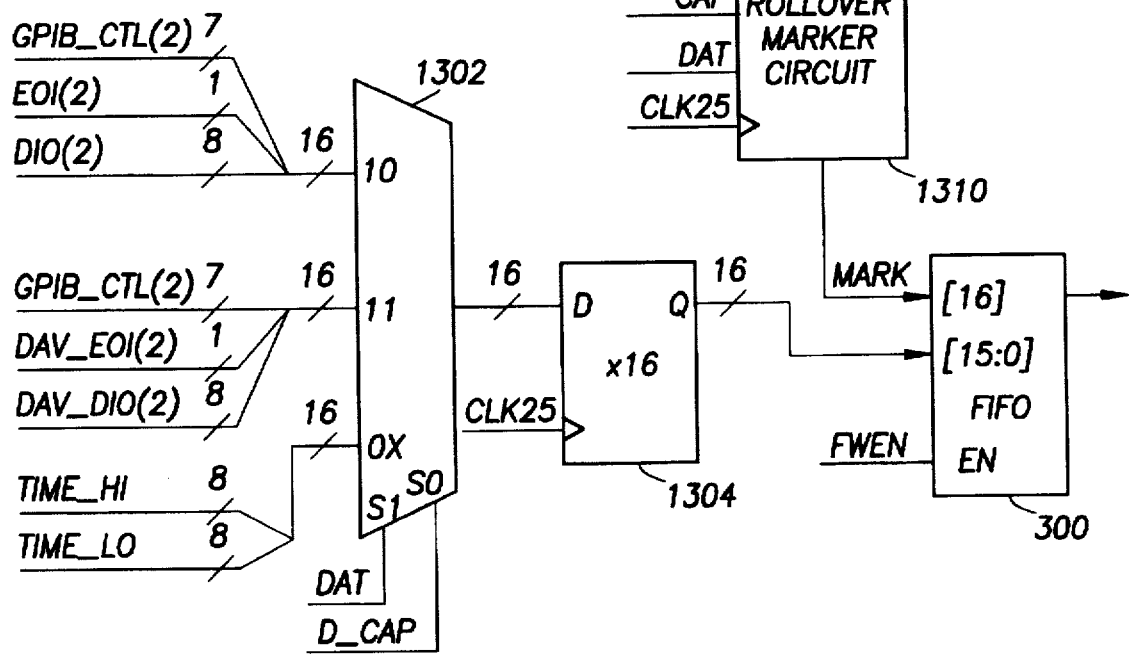
FIG. 13 is a schematic diagram of the multiplexer logic for capturing data into a FIFO buffer.

A D-type flip-flop 802 has its D input pulled high to logic one and receives a CAP signal at its clock input. The CAP signal, described further below, is asserted when any of several capture conditions are true including rollover of the timer 800. The flip-flop 802 asserts a signal STRT_TIM to one input of the AND gate 804 for starting the counter circuit 800 if enabled and not in a reset state. The CAP_EN signal is provided to the inverted reset input of the flip-flop 802 for keeping the counter circuit 800 in the reset state if the CAP_EN signal is deasserted when capture is not enabled. The AND gate 804 receives the TS_EN signal, which is asserted to enable time-stamping. The AND gate 804 also receives a signal RST_TIM*, which is asserted low to reset the counter circuit 800, as will be described more fully below. In this manner, the counter circuit 800 remains in a reset state any time capturing or the time-stamp functions are disabled, or any time the RST_TIM* signal is asserted, indicating the desire to reset the counter circuit 800. Otherwise, the counter circuit 800 counts up from 0, providing a 16-bit time value at its outputs as the signals T[15:0]. The time signals T[15:0] are preferably separated into two 8-bit portions, where the T[15:8] signals are referred to as the TIM_HI byte and the T[7:0] signals are referred to as the TIM_LO byte (FIG. 13).

The counter circuit 800 asserts a time-out signal TO indicating rollover. The TO signal could be asserted when the counter circuit 800 reaches its maximum value of FFFFh, where the T[15:0] signals are all 1's. In the preferred embodiment, however, the counter circuit 800 counts up to the value FFFDh and asserts the TO signal at FFFDh, which occurs two CLK50 cycles before it reaches its maximum value of FFFFh. Upon the next CLK50 cycle, the counter circuit goes to FFFEh and negates the TO signal and two flip-flops 1106 and 1108 (FIG. 11) are clocked to assert the corresponding signals N_CAP and CAP. If the N_CAP signal is asserted when the counter circuit 800 reaches FFFEh indicating a normal capture condition has occurred, it stops counting at FFFEh so that the value FFFEh is written into the FIFO 300 as a normal time-stamp value. This distinguishes a normal capture from a rollover condition occurring without a capture. However, if the N_CAP signal is not asserted at FFFEh, the counter circuit 800 provides the maximum value FFFFh at its output, which is then written to the FIFO 300 indicating a rollover condition rather than a normal time-stamp value.

Time-stamping preferably does not start until the first capture after time-stamping has been enabled. The RST_TIM* signal ensures the counter circuit 800 is held in the reset state until after the first capture and is reset upon each capture. Thus, the time-stamp for the first capture is preferably zero. Since the counter circuit 800 is reset after each capture, each time-stamp value represents the elapsed time since the previous capture. However, if a capture or trigger condition is not met, the counter circuit 800 reaches its maximum value of FFFFh in approximately 3.28 ms. In the preferred embodiment, if the current time-stamp is referred to as x, and the number of time-outs or rollovers since the last capture value is y, then the real time value RT in ns is calculated by the following equation (1):

$$RT(ns)=50(x+1)+3,276,750(y) \qquad (1)$$

Figure 9:
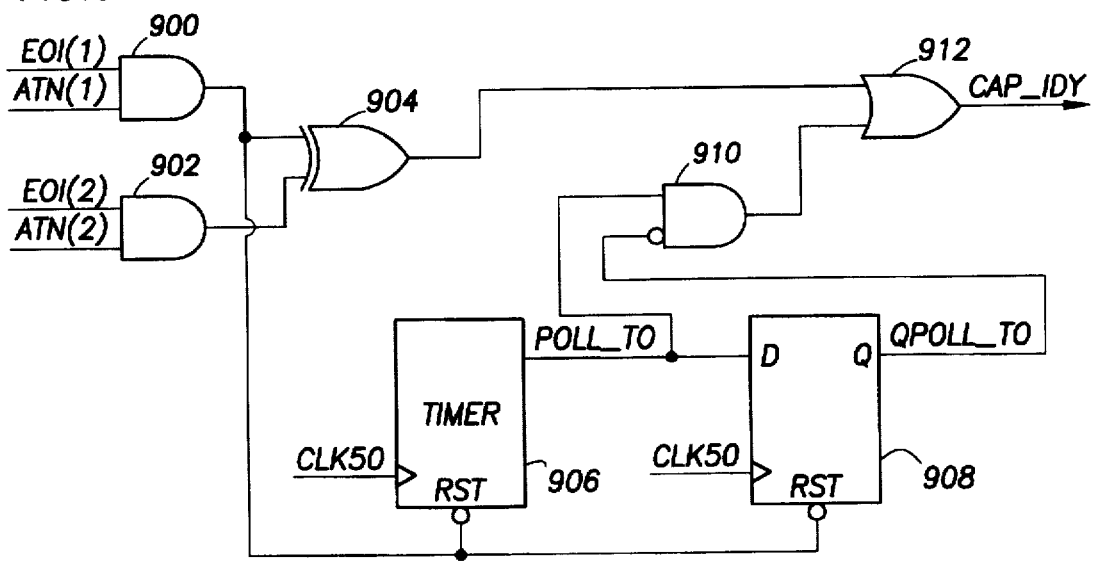
FIG. 9 is a schematic diagram illustrating logic for performing parallel poll.

Referring now to FIG. 9, a logic diagram is shown for identify capture conditions according to parallel poll responses on the GPIB 108. The EOI(1) and ATN(1) signals are each provided to the inputs of a two-input AND gate 900. The EOI(2) and ATN(2) signals are each provided to the inputs of another two-input AND gate 902. The outputs of the AND gates 900, 902 are provided to the respective inputs of a two-input XOR gate 904. The output of the AND gate 900 is also provided to the active low reset inputs of a timer 906 and a D-type flip-flop 908. The timer 906 is preferably a 2 microsecond (µs) timer including a simple up-counter clocked by the CLK50 signal. Thus, after 2 µs, the timer 906 provides a time-out signal, POLL_TO, which is asserted when 2 µs has elapsed since the reset input of the timer 906 was deasserted. The POLL_TO signal is provided to the D input of the flip-flop 908, having its clock input receiving the CLK50 signal. The Q output of the flip-flop 908 provides a signal POLL_TO, which is provided to the inverting input of a two-input AND gate 910. The other, non-inverting input of the AND gate 910 receives the POLL_TO signal. The output of the AND gate 910 is provided to one input of a two-input OR gate 912, which receives the output of the XOR gate 904 at its other input. The output of the OR gate 912 provides the CAP_IDY signal, which indicates appropriate capture conditions according to parallel responses on the GPIB 108.

Operation of the parallel poll circuitry of FIG. 9 is now described. When a parallel poll command is issued, the EOI and ATN signals are both asserted. After a rising edge of the CLK50 signal, both EOI(1) and ATN(1) are asserted thereby removing the reset condition to the timer 906 and the flip-flop 908. Also, since the command was not issued in the prior CLK50 cycle, the EOI(2) and ATN(2) signals are not both asserted so that the XOR gate 904 and the OR gate 912 both assert their outputs high, thereby asserting the CAP_IDY signal. As will be described more fully below, assertion of the CAP_IDY signal causes a sample of the GPIB 108 to be captured. Upon the next CLK50 cycle, the XOR gate 904 deasserts its output low so that the OR gate 912 deasserts the CAP_IDY signal. The XOR gate 904 keeps its output low until the parallel poll command is deasserted.

After 2 µs, the timer 906 asserts the POLL_TO signal while the QPOLL_TO signal is still negated, so that the AND gate 910 asserts its output causing the OR gate 912 to assert the CAP_IDY signal once again. Thus, another sample of the GPIB 108 signals are captured after the GPIB devices 110 have had 2 µs to respond. The flip-flop 908 is then clocked by CLK50 so that the QPOLL_TO signal is asserted, so that the OR gate 912 deasserts the CAP_IDY signal. The QPOLL_TO signal remains asserted until parallel poll command is deasserted. As described further below, sampled data is captured when the QPOLL_TO signal is asserted and while the CAP_DAT signal is asserted, where the assertion of CAP_DAT indicates a change of any one of the DIO signals as described previously. Thus, while the parallel poll command remains asserted, any updated responses by the GPIB devices 110 are captured. Finally, when the parallel poll command is deasserted, the XOR gate 904 once again asserts its output causing the OR gate to assert the CAP_IDY signal, causing one last capture of the DIO data signals at the end of the parallel poll command.

It is appreciated that at least three captures occur during a parallel poll command, a first upon assertion of the command, a second capture after 2 µs, and a third when the parallel poll command is deasserted. Further, more samples are captured anytime the DIO signals change state indicating an updated response to the parallel poll command. Thus, a GPIB system according to the present invention captures all possible responses and updated responses to the parallel poll command.

Figure 10A:
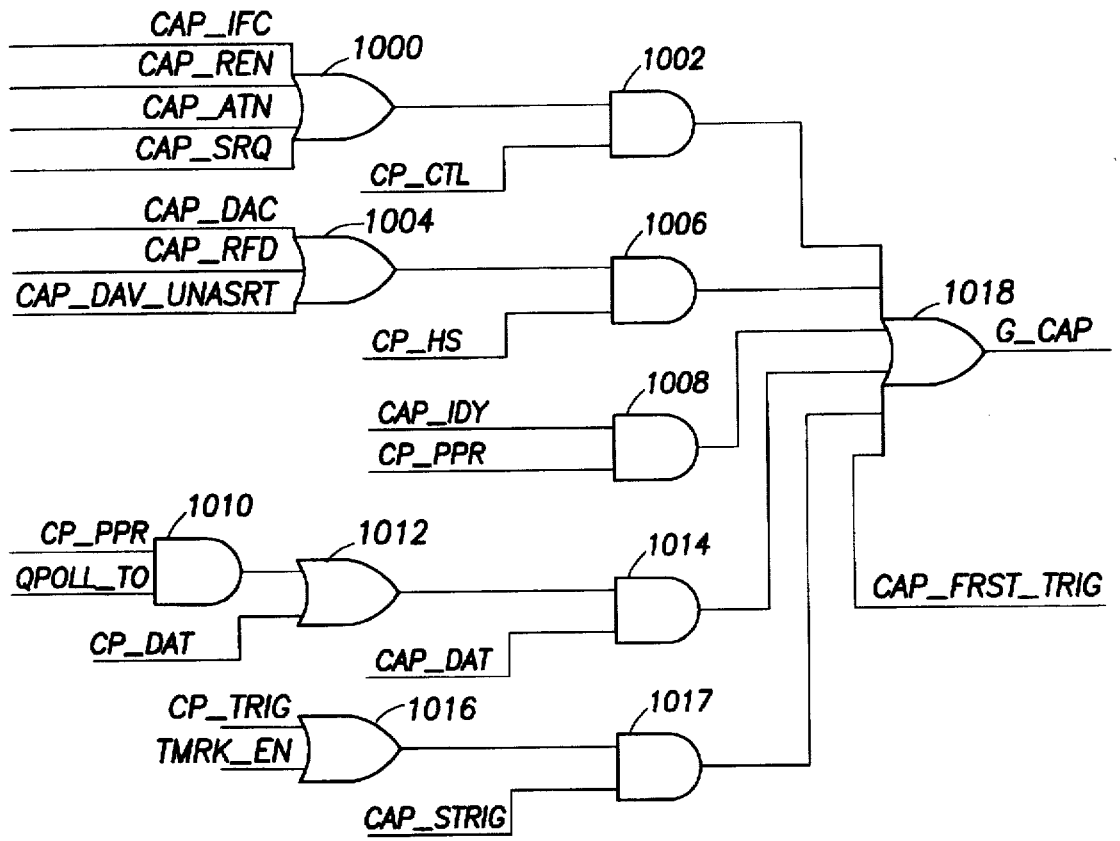
FIGS. 10A and 10B are simplified logic diagrams illustrating logic for identifying predetermined capture conditions of the control and data signals, respectively.

Referring now to FIG. 10A, a logic diagram is shown for identifying certain predetermined capture conditions of the GPIB 108. The CAP_IFC, CAP_REN, CAP_ATN and CAP_SRQ signals are each provided to the four inputs of a four-input OR gate 1000. The output of OR gate 1000 is provided to one input of a two-input AND gate 1002, which receives a capture control line transition signal CP_CTL at its other input. The CP_CTL signal is set in a capture setting register (CPSR) for enabling detection of any changes of the IFC, REN, ATN and SRQ signals. The CAP_DAC and CAP_RFD signals are provided to two inputs of a three-input OR gate 1004, which receives the CAP_DAV_UNASRT signal at its third input. The output of the OR gate 1004 is provided to one input of a two-input AND gate 1006, which receives a capture handshake line transition enable signal CP_HS at its other input, which is set in the CPSR register.

The CAP_IDY signal is provided to one input of a two-input AND gate 1008, which receives a capture on parallel poll response enable signal CP_PPR, which is set in the CPSR register. Thus, if the CP_PPR bit is set in the CPSR register, assertion of the CAP_IDY signal causes a capture of GPIB samples.

The CP_PPR and QPOLL_TO signals are provided to the respective inputs of a two-input AND gate 1010, providing its output to one input of a two-input OR gate 1012, which receives a capture data enable signal CP_DAT at its other input. The CP_DAT bit is set in the CPSR register. The output of the OR gate 1012 is provided to one input of a two-input AND gate 1014, which receives the CAP_DAT signal at its other input. Thus, if the CP_PPR bit is set and the QPOLL_TO signal is asserted, or if the CP_DAT bit is set, the GPIB signals are captured whenever the CAP_DAT signal is asserted.

Certain trigger capture conditions are indicated by signals CAP_STRIG, CP_TRIG, TMRK_EN and CAP_FRST_TRIG, where these signals will not be further described. The CP_TRIG signal is provided to one input of a two-input OR gate 1016 receiving the TMRK_EN signal at its other input. The output of the OR gate 1016 is provided to one input of a two-input AND gate 1017, receiving the CAP_STRIG at its other input. The output of the AND gates 1002, 1006, 1008, 1014 and 1017 as well as the CAP_FRST_TRIG signal are all provided to the respective inputs of a six-input OR gate 1018, which asserts a signal G_CAP when any of the capture conditions of the AND/OR logic described above is detected and enabled.

Figure 10B:
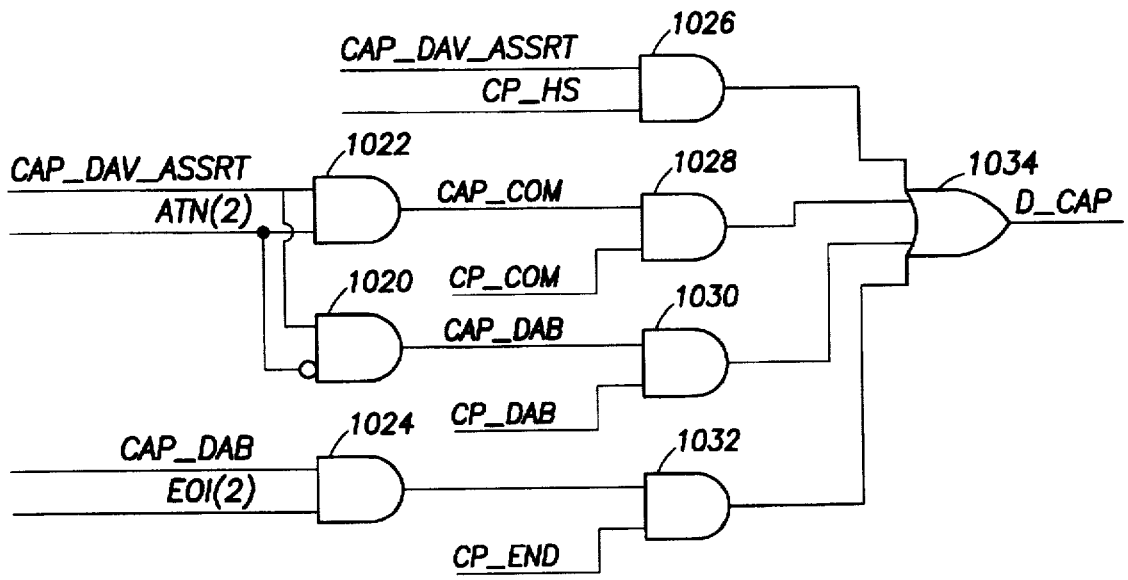

FIG. 10B is a logic diagram for identifying certain capture conditions for capturing the DIO data and EOI signals. A signal CAP_DAV_ASSRT, developed by logic described in FIG. 7A and generally representing assertions of the DAV signal, is provided to one input of a two-input AND gate 1020 having its other inverted input receiving the CAP_ATN(2). The output of the AND gate 1020 provides a signal CAP_DAB representing a data byte transfer on the GPIB 108. The CAP_DAV_ASSRT and CAP_ATN(2) signals are also provided to both non-inverting inputs of a two-input AND gate 1022, which asserts a signal CAP_COM representing a command transfer on the GPIB 108.

The CAP_DAV_ASSRT signal and a capture handshake line transition signal CP_HS are provided to the two inputs of two-input AND gate 1026 which provides its output to one input of a three-input OR gate 1034. The CAP_COM and a capture command enable signal CP_COM are provided to the two inputs of a two-input AND gate 1028, which provides its output to a second input of the OR gate 1034. The CAP_DAB signal is provided to one input of a two-input AND gate 1030, which receives a capture data byte enable signal CP__DAB at its other input. The output of the AND gate 1030 is provided to the third input of the OR gate 1034. The CP__COM, CP__DAB and CP__HS enable signals are preferably set in the CPSR register for enabling these particular capture conditions. The output of the OR gate 1034 asserts a signal D__CAP, which is asserted when any of the enabled capture conditions detected by the AND gate 1026, 1028, 1030 and 1032 are asserted.

Figure 11:
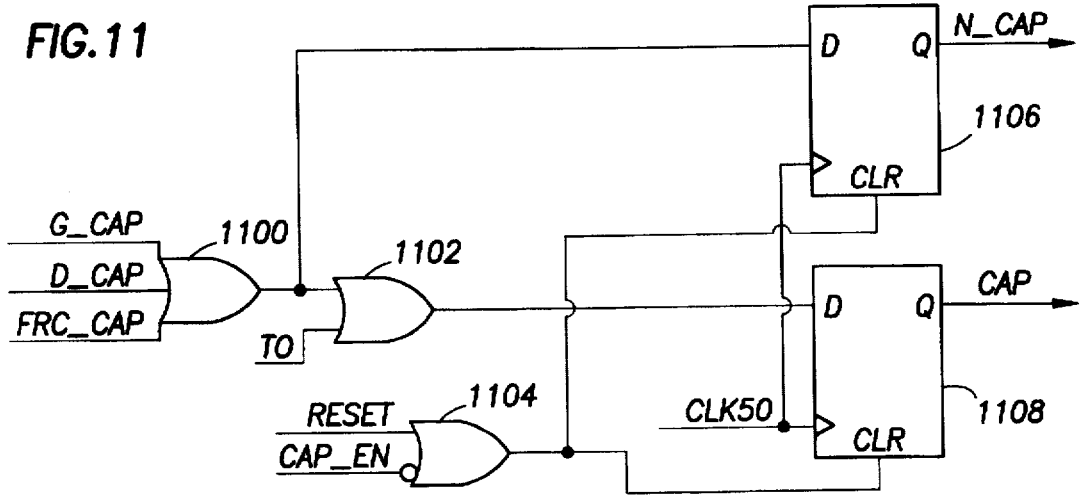
FIG. 11 is a schematic diagram of the logic for identifying all capture conditions on the GPIB.

Referring now to FIG. 11, a schematic diagram is shown of a circuit for detecting any of the capture conditions. The G__CAP, D__CAP and FRC__CAP signals are provided to the three inputs of a three-input OR gate 1100. The output of OR gate 1100 is provided to one input of a two-input OR gate 1102 and also to the D input of a D-type flip-flop 1106. The TO signal from the counter circuit 800 is provided to the other input of the OR gate 1102, which has its output provided to the D input of another D-type flip-flop 1108. The CLK50 signal is provided to the clock inputs of both flip-flops 1106, 1108. The CAP__EN signal is provided to an inverting input of a two-input OR gate 1104 and a signal RESET is provided to the other non-inverting input of the OR gate 1104. The RESET signal is asserted upon any reset conditions of the GPIB analyzer/controller card 106. The output of the OR gate 1104 is provided to the clear inputs of both flip-flops 1106, 1108. The Q output of the flip-flop 1106 provides the normal capture signal N__CAP, which is asserted when capturing is enabled and any time the predetermined or programmed capture conditions occur, as indicated by the G__CAP, D__CAP and FRC__CAP signals. The Q output of the flip-flop 1108 asserts the CAP signal, which is asserted upon the same capture conditions as for the normal N__CAP signal, and also any time time-out of the counter circuit 800 occurs as indicated by the TO signal.

Figure 12A:
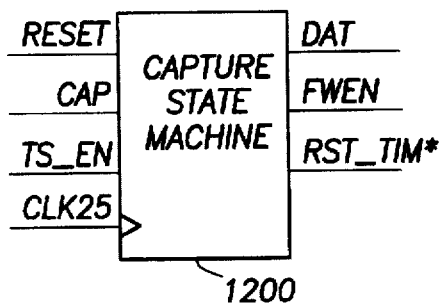
FIGS. 12A and 12B illustrate a capture logic state machine and its operation.

Referring now to FIG. 12A, a block diagram is shown of a capture state machine 1200 for detecting and asserting capture conditions. The capture state machine 1200 receives the RESET, CAP and TS__EN signals at respective inputs, and also receives the CLK25 clock signal at its clock input. The capture state machine 1200 provides two signals DAT, FWEN and the RST__TIM* signal at its three outputs. As will be described more fully below, the DAT signal is asserted by the capture state machine 1200 any time it is desired to capture sampled signals of the GPIB 108. The FWEN signal is a FIFO write enable signal provided to the FIFO 300 when the sampled value is to be written into the FIFO 300. As described previously, the capture state machine 1200 asserts the RST__TIM* signal low to reset the counter circuit 800.

Figure 12B:
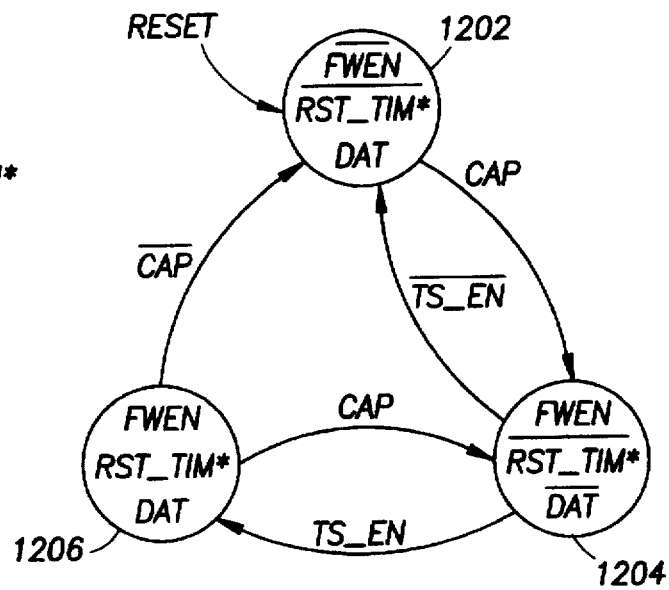

FIG. 12B is a state machine diagram illustrating operation of the capture state machine 1200. A first state 1202 is entered upon reset conditions when the RESET signal is asserted by the GPIB controller/analyzer card 106. In state 1202, the DAT signal is asserted and the FWEN and RST__TIM* signals are negated, where negation is indicated by a bar above the signal name in the Figures. Upon assertion of the CAP signal, indicating any of the data or control capture conditions described previously, the state machine 1200 enters a state 1204 upon the next assertion of the CLK25 clock signal. The FWEN signal is asserted in state 1204 and the DAT signal is negated. The RST__TIM* signal remains negated. If the time-stamp function is disabled, as indicated by a TS__EN signal being negated, then the state machine 1200 reenters state 1202 upon the next assertion of the CLK25 signal. If TS__EN is asserted, the state machine 1200 enters state 1206 upon the next assertion of the CLK25 signal. In state 1206, the FWEN, RST__TIM* and DAT signals are all asserted. Upon the next assertion of the CLK25 signal, if CAP is asserted, the state machine 1200 reenters state 1204 to write another group of data into the FIFO 302. Otherwise, the state machine 1200 reenters state 1202 upon the next assertion of the CLK25 clock signal.

In this manner, sampled signals from the GPIB 108 that meet the capture conditions are written into the FIFO 300 as indicated by the CAP signal being asserted. If time-stamping is enabled, the capture state machine 1200 inserts a time-stamp value from the counter circuit 800 into the next location of the FIFO 300 following the capture value, and the counter circuit 800 is reset. If another capture condition is met before the next rising edge of the CLK25 signal, another sampled value is written into the FIFO 300 followed by another time-stamp value. It is noted that since sampling primarily occurs at 50 ns intervals and thus at a 20 MHz rate, that insertion of the time-stamp value is easily achieved since the capture state machine 1200 is clocked by the CLK25 signal at a 40 MHz rate. Also, the DIO signals sampled asynchronously with assertion of the DAV signal are captured "synchronously" with the capture state machine 1200 followed by a time-stamp value. It is noted that the asynchronous samples have higher priority and are selected over synchronous samples if occurring in the same 50 ns period. Since time-out of the counter circuit 800 is also a "capture" condition, a dummy GPIB sample is written into the FIFO 300 followed by the maximum time-stamp value of FFFFh.

Referring now to FIG. 13, a schematic diagram is shown of select logic 1300, which is preferably located within the capture logic block 410, for providing selected data to the FIFO 300. The GPIB__CTL(2) signals, where the SDAV2 signal as shown in FIG. 7A is considered one of the GPIB__CTL(2) signals, are provided to 7 of 16 bits of the binary 10 input of a 3-input, 16-bit mux 1302. The remaining 9 bits of the binary 10 input receive the EOI(2) and the DIO(2) signals. The 16 bits of the binary 11 input of the mux 1302 receives the GPIB__CTL(2), the DAV__EOI(2) and the DAV__DIO(2) signals. The TIME__HI and TIME__LO bytes are provided to the 16 bits of the binary 0x input of the mux 1302, where "x" indicates a binary 0 or 1 (don't care). The first select input of the mux 1302 is the DAT signal and the second is the D__CAP signal. In this manner, the DAT signal selects between GPIB signals and the time-stamp value, and the D__CAP signal selects between "synchronous" signals, or GPIB signals latched using the CLK50 signal, and "asynchronous" signals, or GPIB signals latched by the DAV signal. It is noted that the asynchronous signals include the CAP__COM and CAP__DAB cases as well as cases with assertions of the DAV signal, with reference to FIG. 10B.

The 16 output bits of the mux 1302 are provided to the D inputs of a set of 16 D-type flip-flops 1304, receiving the CLK25 signal at their clock inputs. The Q outputs of the flip-flops 1304 are provided to 16 inputs of the FIFO 300. The FIFO 300 receives the FWEN signal at its enable input. Thus, sampled data and control signals from the GPIB 108, or time-stamp values from the counter circuit 800, are captured into the FIFO 300 when the FWEN signal is asserted.

The N__CAP, CAP and DAT signals are provided to a timer rollover marker circuit 1310, which also receives the CLK25 signal for purposes of synchronization. The marker circuit 1310 determines whether a capture is due to rollover of the counter circuit 800 as opposed to a normal capture condition by the state of the N__CAP and CAP signals. In particular, if the N__CAP signal is not asserted and the CAP signal is asserted, then a rollover condition has occurred. The marker circuit 1310 also includes memory for determining if the prior capture was due to rollover or a normal capture condition for identifying a first rollover from subsequent consecutive rollovers. If a rollover occurs and the previous capture was a regular capture, so that the rollover is the first rollover, the marker circuit asserts a signal MARK into the seventeenth bit (bit 16) of the FIFO 300 indicating a first time-out (rollover) value. The DAT signal is used to mark the time-stamp time-out value rather than the associated capture data. Only the first time-out value is marked so that any subsequent, consecutive maximum time-out values equal to FFFFh are not marked.

The microprocessor 124 executes a software routine to retrieve data from the FIFO 300 on a regular basis. The computer 102 should retrieve at least two lines (32-bits) once every 3.28 ms to prevent overflow of the FIFO 300. This is a very slow rate so that the computer 102 is easily able to keep the FIFO 300 from overflowing. While the TS_EN signal is asserted so that time-stamping is enabled, every other line in the FIFO 300 is a time-stamp value. The computer 102 easily calculates the elapsed time between successive data captures according to equation (1) provided previously. In one embodiment, the computer 102 monitors the MARK bit (bit 16) and generates an interrupt when the mark bit is set. This informs the software that the time-stamp value is the first maximum value (FFFFh) since the last actual captured data value. The software respondingly counts remaining consecutive occurrences of the maximum value. In another embodiment, the software simply compares each time-stamp value with the maximum value to identify the first and any subsequent consecutive time-out occurrences. The timer rollover marker circuit 1310 and the extra bit of the FIFO 300 would not be necessary.

It is now appreciated that a GPIB system according to the present invention includes several novel features for accurately capturing samples from a GPIB, without missing important data transition events. Furthermore, the GPIB analyzer inserts time-stamp values for accurately determining elapsed time between captured data signals. Since time-out of the time-stamp timer causes a capture condition, the real elapsed time between any two captured samples is readily calculated through software.

Although the system and method of a GPIB analyzer according to the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

I claim:

1. An analyzer for analyzing a bus, comprising:
    capture logic for capturing bus signal samples and corresponding elapsed time values upon predetermined conditions, wherein said elapsed time values represent elapsed time between consecutive ones of said captured samples; and
    a counter coupled to said capture logic, wherein said counter provides said elapsed time values, and wherein said counter indicates a rollover condition and provides a maximum time value upon said rollover condition only if none of said predetermined conditions have occurred at that time, so that said maximum time value is distinguishable from said elapsed time values;
    wherein said capture logic captures said maximum time value upon said rollover condition unless one of said predetermined conditions occurs when said counter indicates a rollover condition in which case said capture logic captures said elapsed time value.

2. The analyzer as recited in claim 1, wherein said capture logic includes a buffer for storing said samples, said elapsed time values, and said maximum time value.

3. The analyzer as recited in claim 2, wherein said capture logic further captures said samples upon said rollover condition, wherein said samples and time values are stored in alternating locations of said buffer, wherein said time values are either said elapsed time values or said maximum time value.

4. The analyzer as recited in claim 2, further comprising a processor coupled to said buffer, wherein said processor calculates a real-time value for elapsed time for one of said samples by adding said elapsed time value for said one of said samples to a number of said maximum time values associated with said one of said samples.

5. The analyzer as recited in claim 4, wherein said buffer comprises a first-in first-out (FIFO) buffer including an extra marker bit for each storage location, and wherein the bus analyzer further comprises marker logic coupled to said counter and to said buffer, said marker logic setting the marker bit for each first occurrence of said maximum elapsed time value captured after a given one of said samples.

6. The analyzer as recited in claim 5, wherein an interrupt is generated in said processor when said processor reads a location in said FIFO having said marker bit set, the interrupt alerting said processor to the presence of at least one maximum time value.

7. The analyzer as recited in claim 1, further comprising a buffer, and wherein said capture logic further comprises:
    a memory circuit for sampling the bus and providing said samples; and
    comparator logic for comparing said samples to said predetermined conditions and for responsively enabling said buffer for storing a value when said predetermined conditions are met and when said counter indicates said rollover condition.

8. The analyzer as recited in claim 7, wherein said capture logic further comprises select logic coupled to said memory circuit, said comparator logic, and said counter, wherein said select logic selects between said samples and time values to be stored in said buffer, wherein said time values are either said elapsed time values or said maximum time value.

9. The analyzer of claim 7, wherein said memory circuit comprises a series of flip-flops.

10. The analyzer as recited in claim 1, wherein before reaching its maximum count value said counter checks if said predetermined conditions have been met and supplies said elapsed time value if said predetermined conditions have been met and supplies said maximum time value if said predetermined conditions have not been met.

11. The analyzer of claim 1, wherein said bus is a General Purpose Interface Bus (GPIB).

12. The analyzer of claim 1, wherein said counter is reset after each one of said samples is captured.

13. The analyzer of claim 1, further comprising a source for providing a clock signal, wherein said counter receives said clock signal, and wherein each of said elapsed time values represents the number of cycles of said clock signal between said samples.

* * * * *